(12) United States Patent
Murakami

(10) Patent No.: US 8,348,568 B2
(45) Date of Patent: Jan. 8, 2013

(54) FASTENING STRUCTURE AND FASTENING METHOD

(75) Inventor: Hajime Murakami, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 173 days.

(21) Appl. No.: 12/754,664

(22) Filed: Apr. 6, 2010

(65) Prior Publication Data

US 2010/0196117 A1  Aug. 5, 2010

Related U.S. Application Data

(63) Continuation of application No. PCT/JP2007/069702, filed on Oct. 9, 2007.

(51) Int. Cl.
*F16B 13/06* (2006.01)

(52) U.S. Cl. .............. 411/45; 411/44; 411/509

(58) Field of Classification Search .......... 411/18, 411/32, 33, 44, 45, 53, 57.1, 60.1, 508–509; 24/297, 453
See application file for complete search history.

(56) References Cited

U.S. PATENT DOCUMENTS

| | | | | |
|---|---|---|---|---|
| 3,147,525 A * | 9/1964 | Texier | ............... | 411/44 |
| 3,918,130 A * | 11/1975 | Poe | ................. | 24/453 |
| 4,405,272 A * | 9/1983 | Wollar | ........................... | 411/41 |
| 4,502,193 A * | 3/1985 | Harmon et al. | ................. | 24/621 |
| 4,726,722 A * | 2/1988 | Wollar | ............................. | 411/32 |
| 4,757,664 A * | 7/1988 | Freissle | .......................... | 52/509 |
| 4,784,550 A * | 11/1988 | Wollar | ............................. | 411/32 |
| 4,952,106 A * | 8/1990 | Kubogochi et al. | ............. | 411/48 |
| 5,163,795 A * | 11/1992 | Benoit et al. | ..................... | 411/45 |
| 5,850,676 A * | 12/1998 | Takahashi et al. | ............... | 24/297 |
| 6,769,849 B2 * | 8/2004 | Yoneoka | .......................... | 411/45 |
| 6,979,162 B2 * | 12/2005 | Kato | ........................... | 411/371.1 |
| 2002/0001513 A1 * | 1/2002 | Tanaka | ............................. | 411/45 |
| 2003/0039528 A1 * | 2/2003 | Yoon | ............................. | 411/45 |
| 2004/0151560 A1 * | 8/2004 | Kirchen | ........................ | 411/508 |
| 2005/0123372 A1 * | 6/2005 | Sato | ................................ | 411/32 |

FOREIGN PATENT DOCUMENTS

| | | |
|---|---|---|
| JP | 49-54058 | 5/1974 |
| JP | 52-21882 | 5/1977 |
| JP | 58-24519 | 2/1983 |
| JP | 2-409 | 1/1990 |
| JP | 5-42722 | 6/1993 |
| JP | 2006-161890 | 6/2006 |

OTHER PUBLICATIONS

English Translation on the International Preliminary Report on Patentability mailed May 4, 2010 in corresponding International Patent Application PCT/JP2007/069702.
International Search Report for PCT/JP2007/069702, mailed Jan. 15, 2008.

* cited by examiner

*Primary Examiner* — Roberta Delisle
(74) *Attorney, Agent, or Firm* — Fujitsu Patent Center

(57) ABSTRACT

A fastening structure includes first and second board-like members to be fastened, a stopping and anchoring part for latching these board-like members to be fastened, and a stopping and anchoring part holding board-like member between the first and second board-like members to be fastened. For a hole of a first inner diameter formed in the first board-like member to be fastened, and a hole of a second inner diameter formed in the second board-like member to be fastened, a smaller hole of a third inner diameter is formed in the stopping and anchoring part holding board-like member, and the impact of gap of the member in production tolerance is avoided thus enhancing the fastening function.

14 Claims, 25 Drawing Sheets

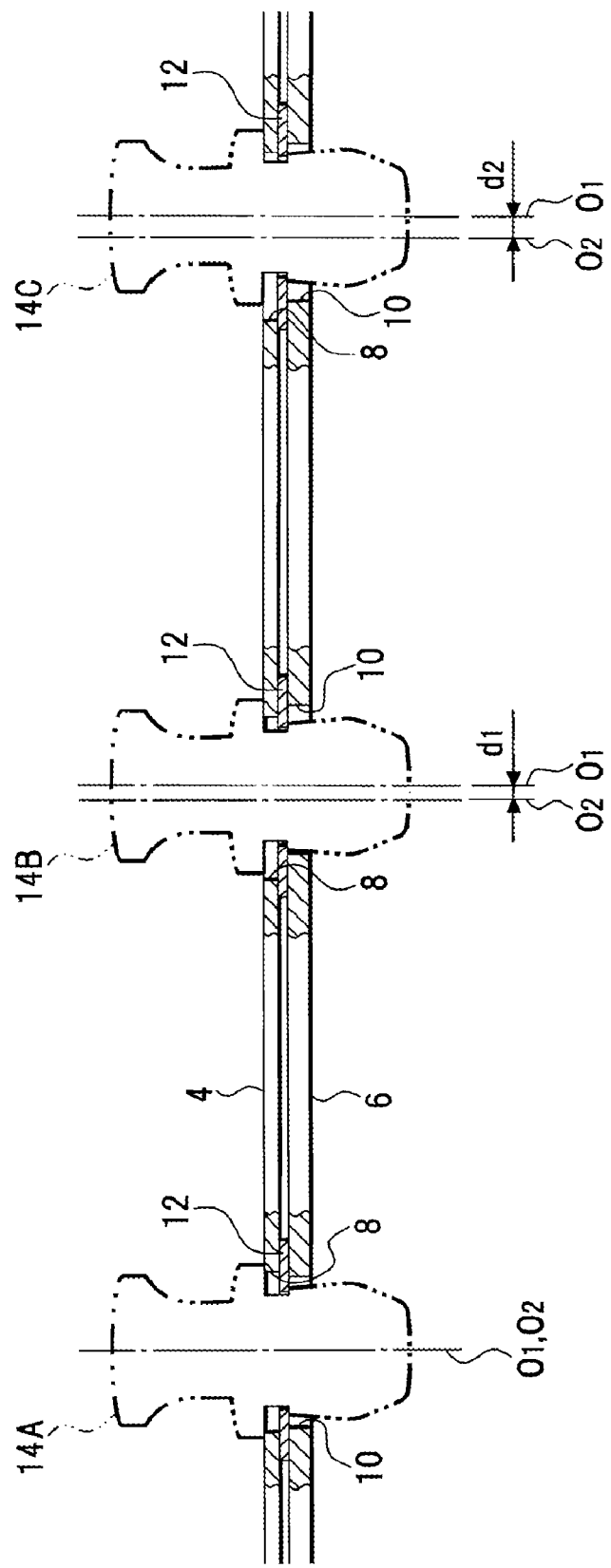

FASTENING STRUCTURE AND FASTENING METHOD

CROSS-REFERENCE TO RELATED APPLICATIONS

This application is a continuation of International Application No. PCT/JP2007/069702, filed on Oct. 9, 2007, now pending, herein incorporated by reference.

FIELD

The embodiments discussed herein are related to a fastening structure and a fastening method that are used to fasten together a plurality of board-like members for a housing that is configured by fastening together the board-like members, of an electronic apparatus, etc., such as a server apparatus.

BACKGROUND

A fastening part such as a nylatch is used to fasten together a plurality of board-like members such as plates. A nylatch is a part to, for example, fasten two plates, is formed by a resin, etc., and is capable of locking and unlocking plates with/from each other at a touch. In fastening together plates using a nylatch, when the nylatch is forcibly inserted into holding holes formed in the plates, the tip of the nylatch is deformed and the nylatch is held by the plates.

Concerning a fastening structure using such a fastening part, Japanese Laid-Open Utility Model Publication No. 05-42722 discloses a trim with a clip wherein the clip is fitted to the trim in advance such that the clip is not detached from the trim, by fitting a spacer from the tip of the clip that is fixed penetrating the trim that is a board-like member and wherein the trim and a panel are fastened together by the clip by fitting the clip of the trim into a clipping hole of the panel (abstract, FIG. 3, etc.).

When the nylatch or the trim with a clip (Japanese Laid-Open Utility Model Publication No. 05-42722) is used as a fastening member, it is essential that the positions of the fitting holes for the nylatch or the clip to penetrate therethrough coincide among the members.

For the trim with a clip (Japanese Laid-Open Utility Model Publication No. 05-42722), the trim is fixed by sandwiching the trim using the head of the clip and the spacer and, thereby, the clip is adapted to avoid being pulled out from the trim. This clip is attached by forcibly inserting the clip into the hole in the panel and the holding hole of the clip is formed being larger than the shaft diameter.

When a nylatch is used, as depicted in FIG. 1, a nylatch 200 is fitted penetrating a holding hole 204 formed in a nylatch holding plate 202. An anchoring unit 206 of the nylatch 200 penetrates the holding hole 204 and, thereby, is caused to protrude on the backside of the nylatch holding plate 202. In this state, the anchoring unit 206 can be inserted into a fixing hole 210 of a plate to be fastened 208. That is, FIG. 1 depicts the nylatch 200 in its unlocked state.

To fasten together the nylatch holding plate 202 and the plate to be fastened 208, as depicted in FIG. 2, a locking bar-like portion 212 of the nylatch 200 is forcibly inserted in the direction indicated by an arrow "a" into the nylatch holding plate 202, which is directly put on the plate to be fastened 208, and the plate to be fastened 208, and the anchoring unit 206 is pushed to be opened in the direction of its diameter (arrow b) by the locking bar-like portion 212 inserted therein. As a result, the nylatch holding plate 202 and the plate to be fastened 208 are fastened together using the nylatch 200 as the medium and the nylatch 200 is locked.

As above, for the nylatch 200, the nylatch 200 is held in the holding hole 204 of the nylatch holding plate 202 and the anchoring unit 206 is inserted into the fixing hole 210 of the plate to be fastened 208. Therefore, it is essential that the position of the holding hole 204 and the position of the fixing hole 210 respectively of the nylatch holding plate 202 and the plate to be fastened 208 to be fastened together coincide or are close to each other. The precision of the hole diameter of each of the holding hole 204 and the fixing hole 210 is also important to maintain the precision of the fastening.

Because the nylatch 200 can be fitted at a touch as above, its workability is excellent. However, it is necessary to specify strict manufacture tolerances of the fitting plates that include the holding hole 204 and the fixing hole 210. As depicted in FIG. 3, assuming that a plurality of nylatches 200A, 200B and 200C are used, differences are generated between the positions of the holding holes 204 and those of the fixing holes 210 due to accumulation of the manufacture tolerances of the nylatch holding plate 202 and the plate to be fastened 208. Therefore, when the central axis $O_{11}$ of the holding hole 204 and the central axis $O_{12}$ of the fixing hole 210 are caused to coincide with each other to fix the nylatch 200A and the nylatch 200A is fixed, a position difference $d_{11}$ ($<d_{12}$) is generated between the central axis $O_{11}$ of the holding hole 204 and the central axis $O_{12}$ of the fixing hole 210 for the nylatch 200B that is adjacent to the nylatch 200A, and the position difference $d_{12}$ ($>d_{11}$) that is generated between the central axis $O_{11}$ of the holding hole 204 and the central axis $O_{12}$ of the fixing hole 210 for the nylatch 200C becomes larger. Therefore, though the nylatch 200B can be fixed, inconvenience occurs that the nylatch 200C even may not be inserted not to mention fixing of it, etc.

To enable a plurality of nylatches such as the nylatches 200A, 200B and 200C to be fixed, the differences caused by the manufacture tolerances need to be absorbed and the hole diameter of each of the holding holes 204 and the fixing holes 210 needs to be increased. When hole diameters $\phi_{11}$ and $\phi_{12}$ respectively of the holding hole 204 and the fixing hole 210 are set to be large, the insertion of the nylatch 200 becomes easy. However, as depicted in FIG. 4, when each of the hole diameters $\phi_{11}$ and $\phi_{12}$ is larger than an outer diameter $\phi_{10}$ of the nylatch 200, the fastening function of the nylatch 200 is degraded and, when the hole diameter $\phi_{11}$ of the holding hole 204 of the nylatch holding plate 202 is set to be $\phi_{11} > \phi_{10}$, the nylatch 200 may not be held in its unlocked state. In the case where the nylatch 200 is released from the nylatch holding plate 202, another nylatch needs to be prepared when the nylatch 200 is lost or when the nylatch 200 is tried to be again fitted, etc. Therefore, the workability is degraded.

Japanese Laid-Open Utility Model Publication No. 05-42722 includes no suggestion or no disclosure concerning the above problems and also includes no disclosure about any means of solving those problems.

SUMMARY

According to an aspect of the embodiments of the present invention, a fastening structure to fasten together a first board-like member to be fastened having a hole of a first inner diameter and a second board-like member to be fastened having a hole of a second inner diameter includes a stopping and anchoring part holding board-like member to be disposed between the first and the second board-like members to be fastened, the stopping and anchoring part holding board-like member having a hole of a third inner diameter, the third inner diameter being smaller than the first inner diameter; and a stopping and anchoring part to include a cylinder portion to have an outer diameter, the outer diameter being equal or approximate to the third inner diameter; a stopping portion to be formed on an upper portion of the cylinder portion, the stopping portion having an outer diameter, the outer diameter being larger than the first inner diameter; and an anchoring unit to be formed in a lower portion of the cylinder portion, the anchoring unit having an outer diameter, the outer diameter being equal or approximate to the second inner diameter, wherein the stopping and anchoring part fastens together the first and the second board-like members to be fastened due to the cylinder portion being held by the holding board-like member by being fitted into the holes of the first and the third inner diameters, and the anchoring unit fixing itself to the second board-like member to be fastened.

According to another aspect of the embodiments of the present invention, a fastening method of fastening together a first board-like member to be fastened having a hole of a first inner diameter and a second board-like member to be fastened having a hole of a second inner diameter includes disposing a stopping and anchoring part holding board-like member having a hole of a third inner diameter that is smaller than the first inner diameter, between the first and the second board-like members to be fastened; causing the holding board-like member to hold a cylinder portion of a stopping and anchoring part that has the cylinder portion having an outer diameter equal or approximate to the third inner diameter, a stopping portion that is formed on an upper portion of the cylinder portion and that has an outer diameter larger than the first inner diameter, and an anchoring unit that is formed in a lower portion of the cylinder portion and that has an outer diameter equal or approximate to the second inner diameter, by fitting the cylinder portion into the holes of the first inner diameter and the third inner diameter, and anchoring the anchoring unit to the second board-like member to be fastened; and fastening together the first and the second board-like members to be fastened using the stopping and anchoring part.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

Other objects, features and advantages of the present invention will become more apparent when reading the embodiments herein with reference to the accompanying drawings.

BRIEF DESCRIPTION OF DRAWINGS

FIG. 14 is a diagram of a fastening structure that avoids the influence of differences caused by manufacturing tolerances;

DESCRIPTION OF EMBODIMENTS

An embodiment of the present invention includes a first and second board-like members to be fastened that are to be fastened together, a stopping and anchoring part to stop and anchor the board-like members to be fastened, and a stopping and anchoring part holding board-like member between the first and second board-like members to be fastened. A hole having a third inner diameter that is smaller than a hole having a first inner diameter formed in the first board-like member to be fastened and a hole having a second inner diameter formed in the second board-like member to be fastened, is formed in the stopping and anchoring part holding board-like member. The stopping and anchoring part holding board-like member between the first and the second board-like members to be fastened holds the stopping and anchoring part and, thereby, an influence of differences caused by manufacture tolerances of the members is avoided and the fastening function is enhanced.

First Embodiment

Figure 5:
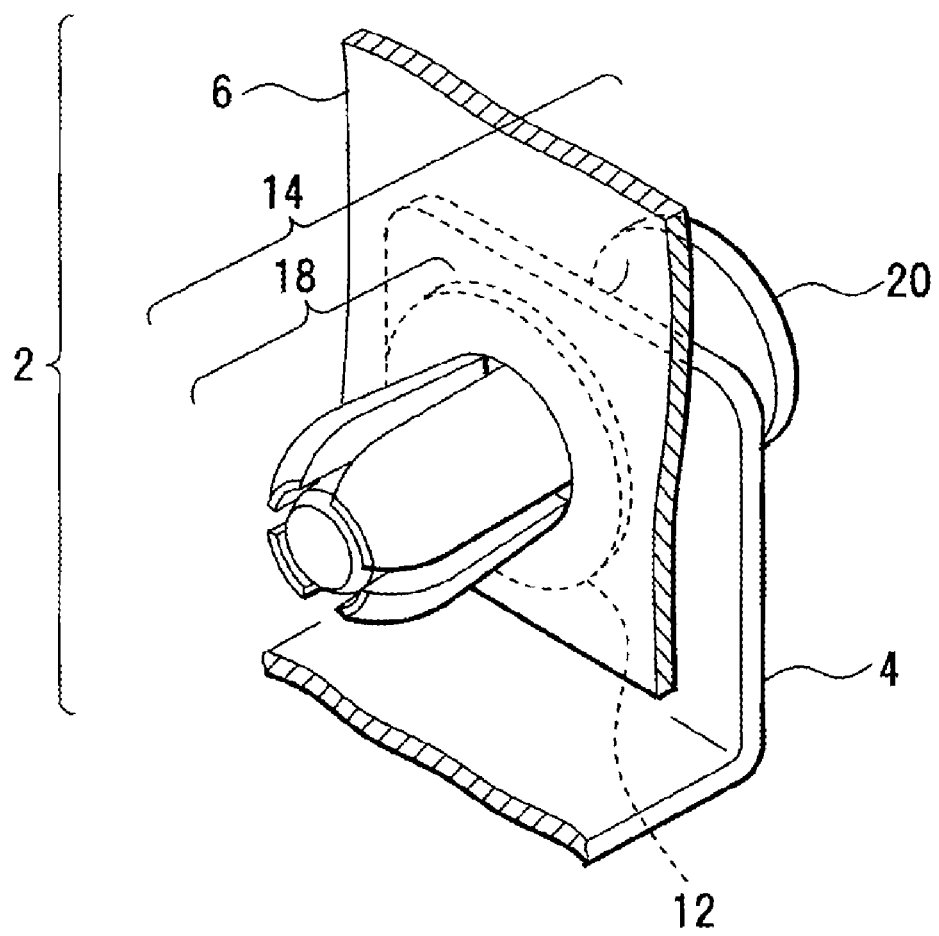
FIG. 5 is a perspective view of a fastening structure according to a first embodiment.
Figure 6:
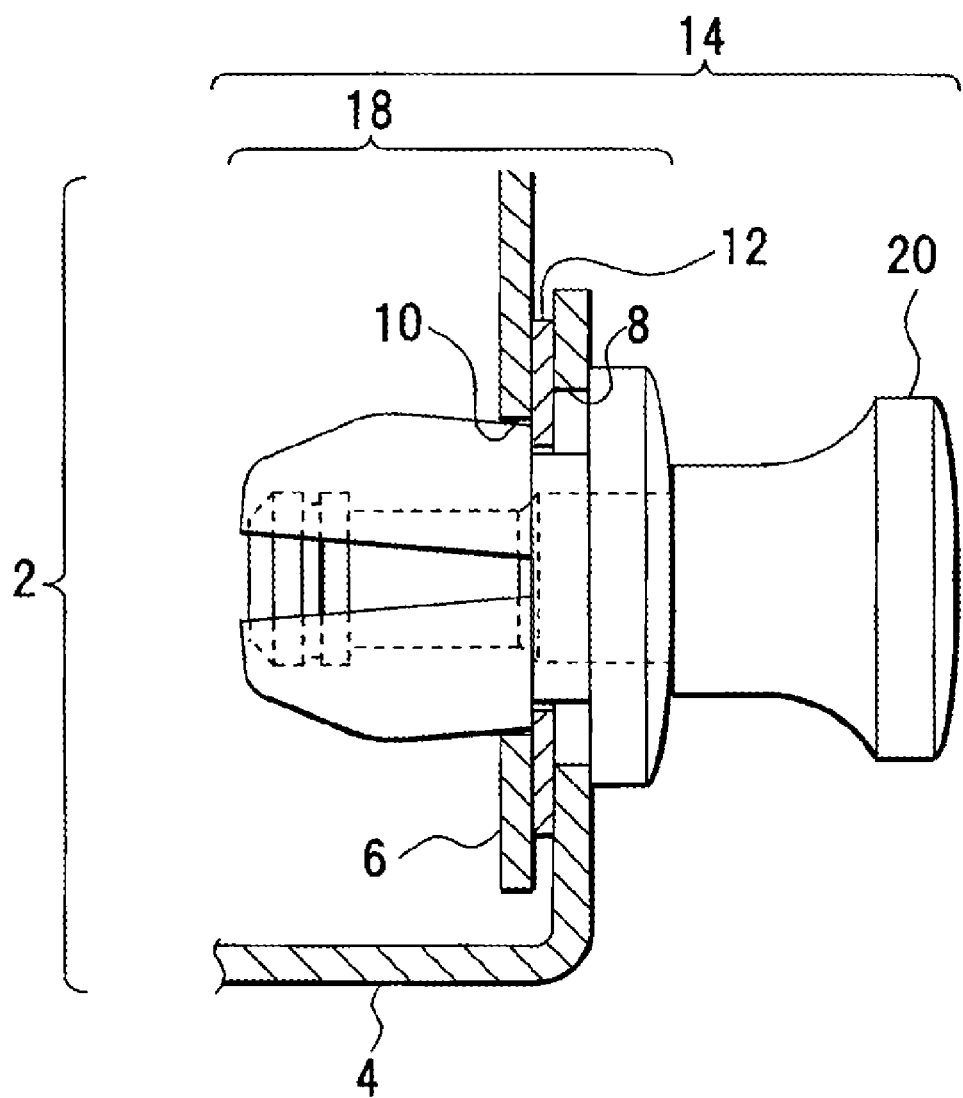
FIG. 6 is a diagram of the fastening structure.
Figure 7:
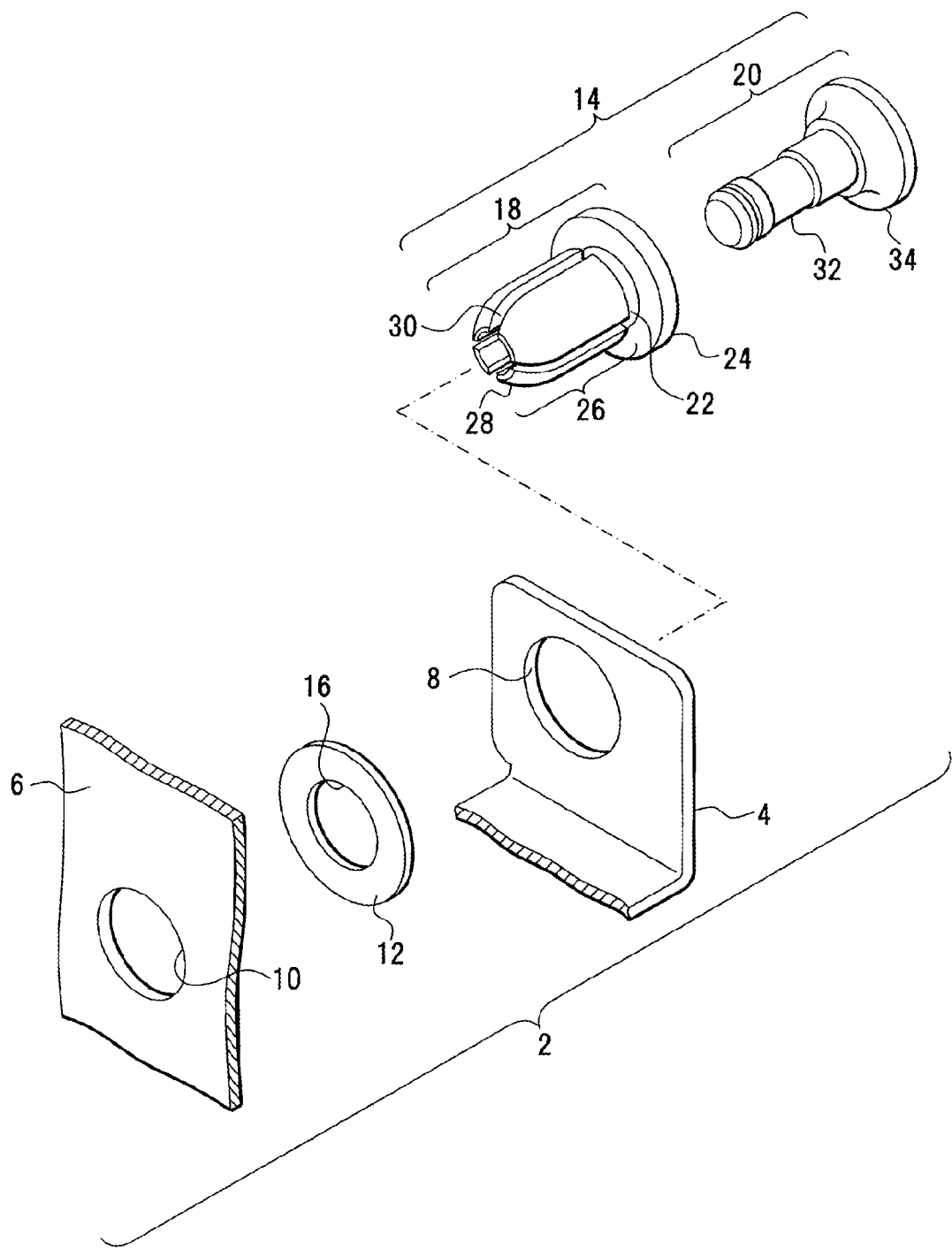
FIG. 7 is an exploded perspective view of the fastening structure.
Figure 8:
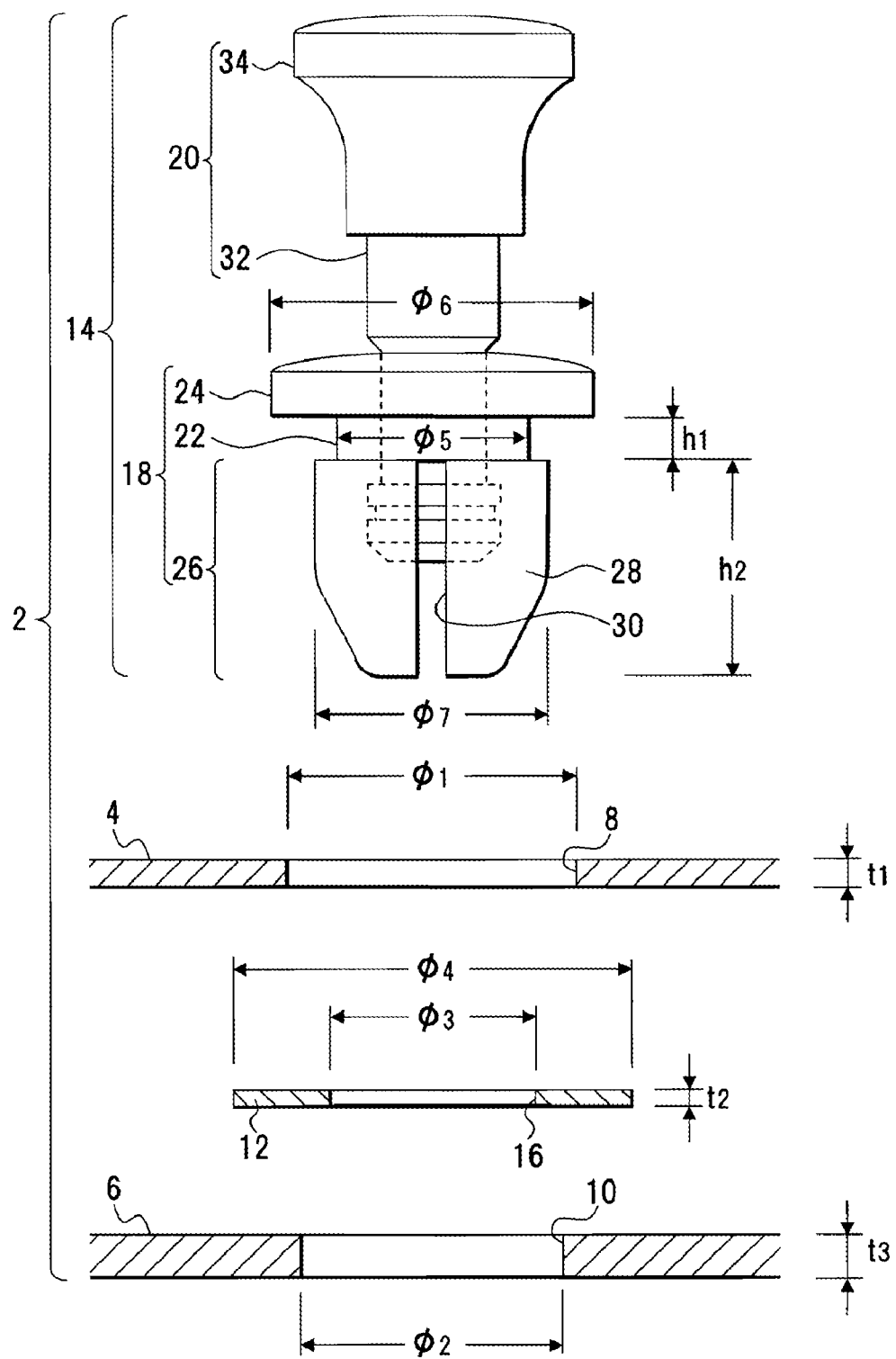
FIG. 8 is a diagram of the relation among the sizes of the members.
Figure 9:
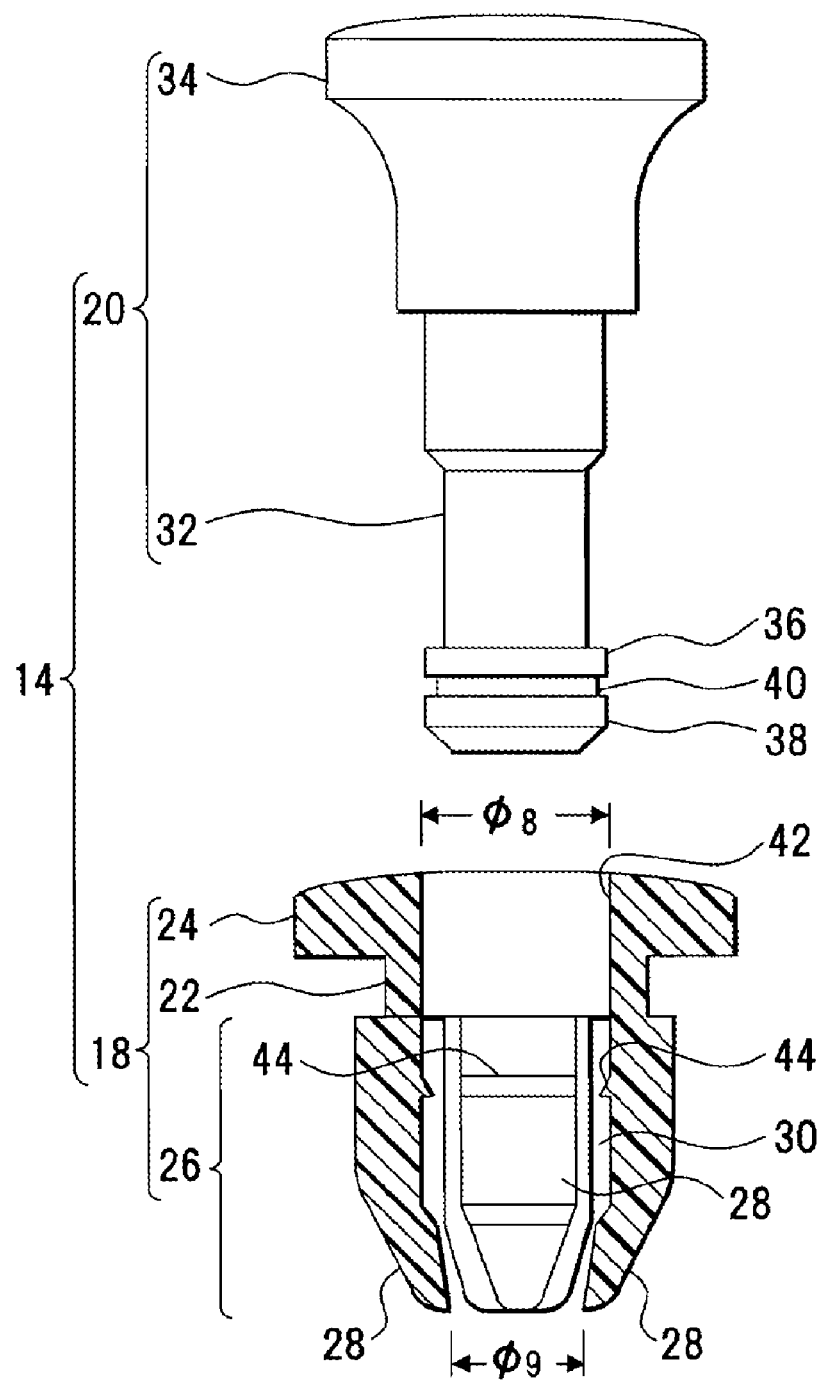
FIG. 9 is a diagram of the structure of a nylatch.

A first embodiment of the present invention will be described with reference to FIGS. 5 to 9. FIG. 5 is a perspective view of a fastening structure. FIG. 6 depicts the fastening structure. FIG. 7 is an exploded perspective view of the fastening structure depicting the fastening structure being disassembled. FIG. 8 depicts the relation among the sizes of the members. FIG. 9 depicts the structure of a nylatch.

As depicted in FIGS. 5 to 7, in this fastening structure 2: for example, a plate to be fastened 4 is used as the first board-like member to be fastened; for example, a plate to be fastened 6 is used as the second board-like member to be fastened; a hole 8 is formed in the plate to be fastened 4; and a hole 10 is formed in the plate to be fastened 6. The hole 8 has a first inner diameter $\phi_1$ and the hole 10 has a second inner diameter $\phi_2$ (FIG. 8). The holes 8 and 10 may be polygonal, oblong, etc., in addition to being circular. For example, when the holes are oblong, the inner diameters $\phi_1$ and $\phi_2$ only have to be the minor axes of the holes. The relation of the inner diameters $\phi_1$ and $\phi_2$ may either be $\phi_1 \geqq \phi_2$ or $\phi_1 \leqq \phi_2$.

For example, a holding plate 12 as the stopping and anchoring part holding board-like member is set between the plates to be fastened 4 and 6 that are the board-like members to be fastened. This holding plate 12 is a doughnut-formed board-like member to hold a nylatch 14 that is an example of the stopping and anchoring part, and has a hole 16 formed therein to hold the nylatch 14 to be inserted. This hole 16 has a third inner diameter $\phi_3$ and the inner diameter $\phi_3$ is set to be smaller than the inner diameter $\phi_1$ ($\phi_3 < \phi_1$). An outer diameter $\phi_4$ of the holding plate 12 is larger than the inner diameters $\phi_1$ and $\phi_2$ of the holes 8 and 10 ($\phi_4 > \phi_1$ and $\phi_4 > \phi_2$) (FIG. 8). Though the holding plate 12 is circular in this embodiment, the holding plate 12 may be polygonal or oblong in addition to being triangular or square.

The nylatch 14 is an example of the stopping and anchoring part as above and the nylatch 14 includes a latch main body 18, and a latch operating unit 20 as an example of the bar-like member. The nylatch 14 is formed by an elastic material such as a synthetic resin. This nylatch 14 is held in its locked state by inserting the latch operating unit 20 into the latch main body 18 and, thereby, causing the latch main body 18 to hold the latch operating unit 20, and is held in its unlocked state by pulling backward or releasing the latch operating unit 20 from the latch main body 18.

The latch main body 18 includes a cylinder portion 22, a stopping portion 24 and an anchoring unit 26. The cylinder portion 22 has an outer diameter $\phi_5$ that is equal or approximate to the inner diameter $\phi_3$ of the hole 16 of the holding plate 12 (FIG. 8). The cylinder portion 22 is attached with the plate to be fastened 4 and the holding plate 12.

The stopping portion 24 is a board-like portion formed on the upper portion of the cylinder portion 22, and has an outer diameter $\phi_6$ ($> \phi_1$) that is larger than the inner diameter $\phi_1$ of the hole 8 of the plate to be fastened 4 (FIG. 8). Denoting the height of this cylinder portion 22 as "$h_1$", the thickness of the plate to be fastened 4 as "$t_1$", and the thickness of the holding plate 12 as "$t_2$", the height $h_1$ only has to be set to be as follows.

$$h_1 = t_1 + t_2 \qquad (1)$$

or $$h_1 \approx t_1 + t_2 \qquad (2)$$

That is, the height $h_1$ is equal or approximate to a value obtained by totaling the thickness $t_1$ of the plate to be fastened 4 and the thickness $t_2$ of the holding plate 12 (FIG. 8).

The anchoring unit 26 is formed on the lower portion of the cylinder portion 22, has a cylinder shape whose outer circumference becomes smaller toward the tip thereof, and has an outer diameter $\phi_7$ that is equal or approximate to the inner diameter $\phi_2$ of the hole 10 of the plate to be fastened 6. This anchoring unit 26 includes, for example, four anchoring pieces 28 as a plurality of boards disposed on the same circumference with spacing between each other, and slits 30. The anchoring pieces 28 inserted into the hole 10 of the plate to be fastened 6 are curved and opened toward their outer circumference and, thereby, the anchoring unit 26 is anchored to the plate to be fastened 6. Denoting the height of the anchoring unit 26 as $h_2$, and the thickness of the plate to be fastened 6 as $t_3$, the height $h_2$ is $h_2 > t_3$ (FIG. 8).

As depicted in FIG. 9, the latch operating unit 20 that is inserted in the latch main body 18 to operate the latch main body 18 into its locked or unlocked state includes a bar-like portion 32 and a head portion 34.

On the tip and an intermediate portion on the tip side of the bar-like portion 32, annular protrusions 36 and 38 as protrusions to forcibly open the anchoring unit 26 of the latch main body 18 are formed sandwiching a stopping groove 40. An insertion hole 42 is formed in the latch main body 18 into which the bar-like portion 32 is inserted. A stopping portion 44 is formed on the inner wall of each of the anchoring pieces 28 that extend to the insertion hole 42 and the stopping portions 44 are inserted into the stopping groove 40 of the bar-like portion 32 inserted into the latch main body 18.

The tip of each of the anchoring pieces 28 forms a curved face that is smaller than the inner diameter of the insertion hole 42, and is adapted to be forcibly opened by the insertion of the bar-like portion 32. Denoting the inner diameter of the insertion hole 42 as $\phi_8$ and the inner diameter of the tip of each anchoring piece 28 to be reached by the annular protrusion 38 of the bar-like portion 32 as $\phi_9$, these inner diameters are set to be $\phi_8 > \phi_9$.

The head portion 34 is formed on the upper portion of the bar-like portion 32, and constitutes an operation grip to operate, that is, attach, detach, insert, or release the latch operating unit 20.

The latch main body 18 of the nylatch 14 is movable freely over the length of an interstice of the hole 8 for floating. Therefore, even when the hole 10 for fastening is out of alignment due to scatter of the manufacture tolerances, the latch main body 18 of the nylatch 14 can be moved and fixed and the plates to be fastened 4 and 6 can be fastened.

Since the latch main body 18 of the nylatch 14 is held, the nylatch 14 is not detached in its unlocked state and, therefore, the workability of the fitting and the fastening can be improved.

Figure 10:
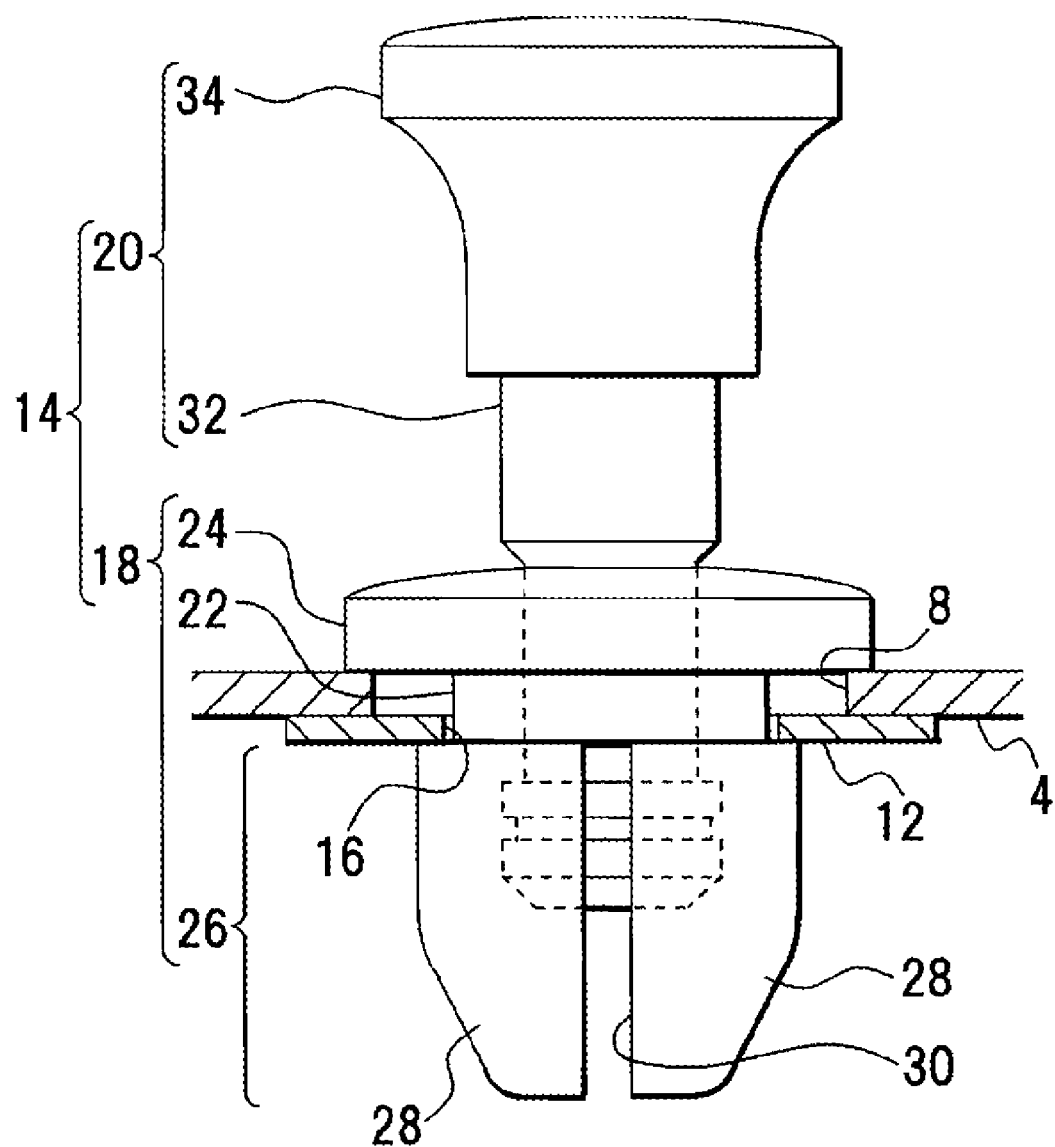
FIG. 10 is a diagram of a holding process of a latch main body.
Figure 11:
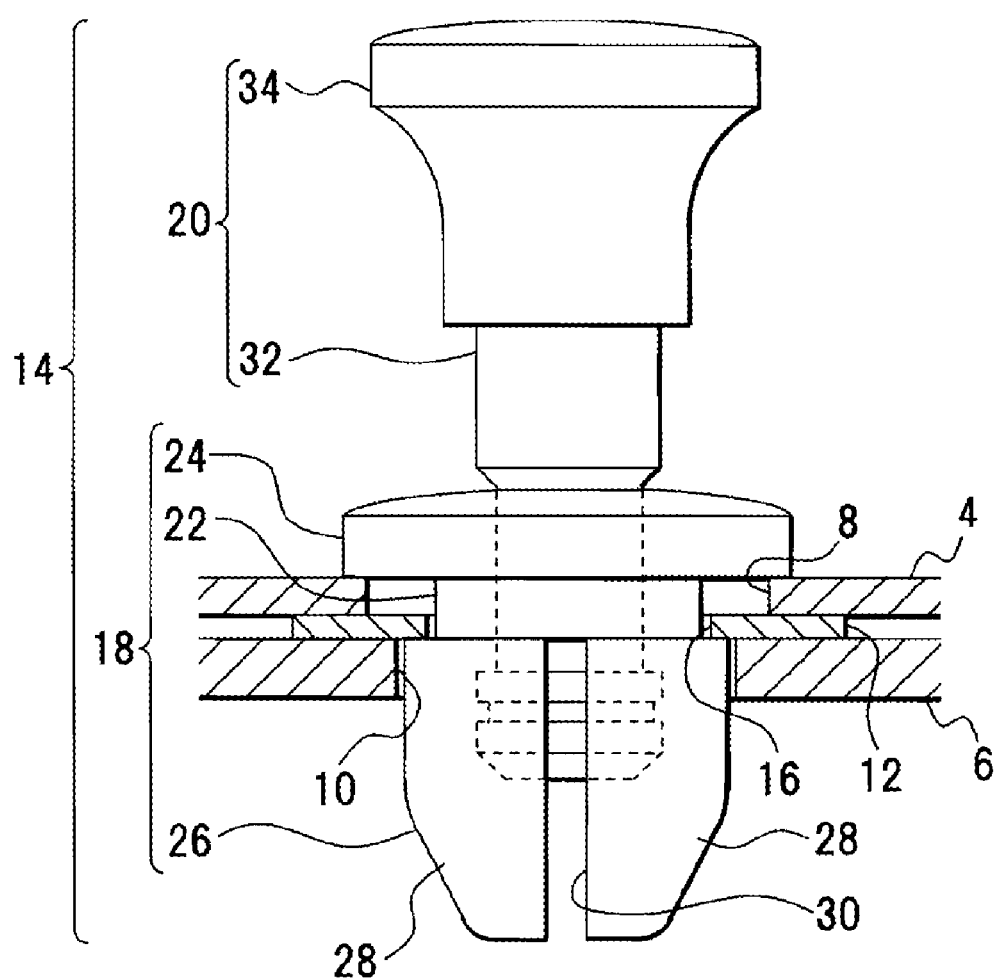
FIG. 11 is a diagram of a process of attaching plates to be fastened to the latch main body.
Figure 12:
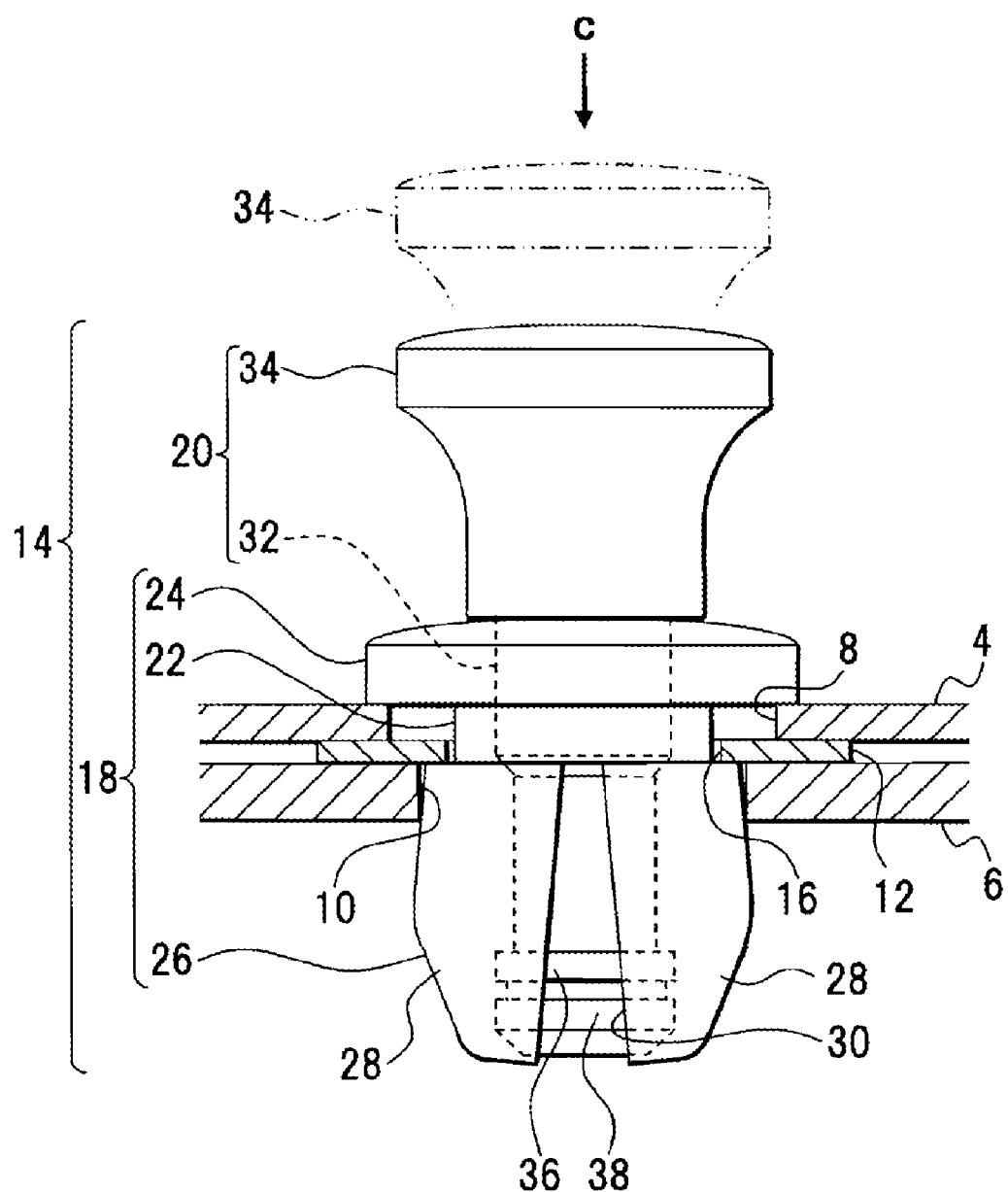
FIG. 12 is a diagram of a fastening process.

A fastening method will be described with reference to FIGS. 10 to 12. FIG. 10 depicts a holding process of the latch main body. FIG. 11 depicts a process of attaching the plates to be fastened to the latch main body. FIG. 12 depicts a fastening process. In FIGS. 10 to 12, the same parts as those in FIGS. 5 to 9 are given the same reference numerals.

(1) Holding Process of Nylatch 14

In the holding process of the nylatch 14: the hole 8 as a hole for floating is opened in the plate to be fastened 4; the doughnut-like holding plate 12 formed therein with the nylatch holding hole 16 holds the latch main body 18 of the nylatch 14; and, thereby, the holding plate 12 is held being gripped between the plates to be fastened 4 and 6. As depicted in FIG. 10: the holding plate 12 is disposed on the backside of the plate to be fastened 4 that is one of the board-like members to be fastened; the cylinder portion 22 and the anchoring unit 26 of the latch main body 18 are inserted into the hole 8 of the plate to be fastened 4 and the hole 16 of the holding plate 12; and the plate to be fastened 4 and the holding plate 12 are set around the cylinder portion 22. On the cylinder portion 22, the plate to be fastened 4 is sandwiched by the stopping portion 24 of the nylatch 14 and the holding plate 12 and the latch main body 18 of the nylatch 14 is held by the plate to be fastened 4.

In this case, when the latch operating unit 20 is temporarily fixed to the latch main body 18, the nylatch 14 is held by the plate to be fastened 4 and, therefore, loss, etc., of the nylatch 14 can be prevented.

(2) Process of Attaching Plate to be Fastened 6

As depicted in FIG. 11, in this process of attaching the plate to be fastened 6, the plate to be fastened 6 is attached to the anchoring unit 26 of the latch main body 18 held by the plate to be fastened 4. In this case, the anchoring unit 26 is inserted into the hole 10 of the plate to be fastened 6 and the plate to be fastened 6 is overlapped on the holding plate 12.

(3) Fastening Process

As depicted in FIG. 12, in this fastening process, when, keeping the plate to be fastened 6 on the underside of the holding plate 12, a force is applied in the direction indicated by an arrow "c" to the head portion 34 of the latch operating unit 20 of the nylatch 14 and, thereby, the latch operating unit 20 is pushed down and, thereby, the bar-like portion 32 is moved into the anchoring unit 26, the anchoring pieces 28 of the anchoring unit 26 are forcibly curved and opened by the annular protrusions 36 and 38 of the bar-like portion 32. As a result, the anchoring pieces 28 are strongly pushed onto the inner wall of the hole 10 of the plate to be fastened 6 and the anchoring unit 26 is deformed such that the anchoring unit 26 has an outer circumference that is larger than the diameter of the hole 10 under the underside of the plate to be fastened 6. Therefore, the plate to be fastened 6 is strongly fastened to the plate to be fastened 4 sandwiching the holding plate 12 therebetween, by the latch main body 18 and the fastening structure 2 is obtained.

Figure 13A:
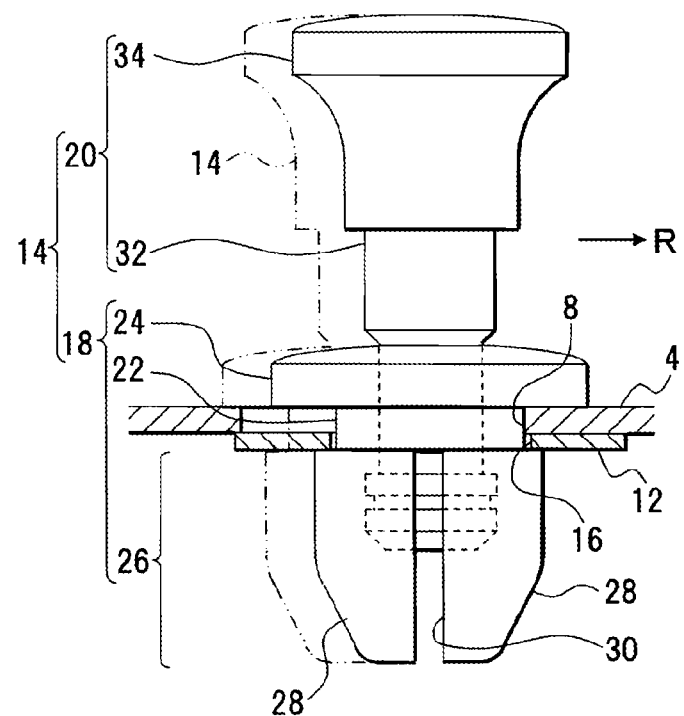
FIGS. 13A and 13B are diagrams of floating of the latch main body.
Figure 13B:
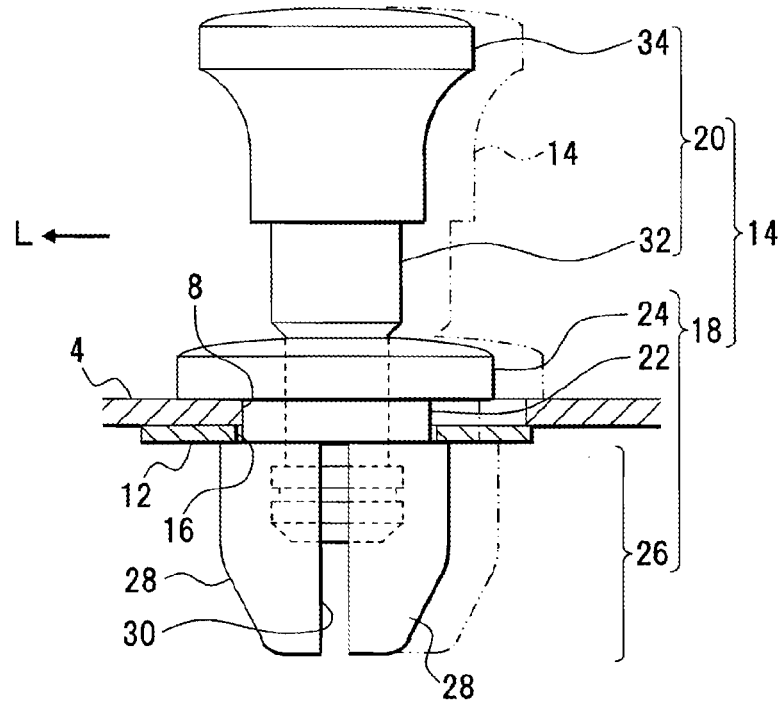

The manufacture tolerances and the fastening of the board-like members to be fastened will be described with reference to FIGS. 13A, 13B and 14. FIGS. 13A and 13B depict the floating of the latch main body. FIG. 14 depicts the fastening structure that avoids the influence of the differences caused by the manufacturing tolerances. In FIGS. 13A, 13B and 14, the same parts as those in FIGS. 5 to 9 are given the same reference numbers.

In the case where the inner diameter $\phi_1$ of the hole 8 that is a through hole for floating is formed to be an increased inner diameter to absorb the manufacture tolerances of the plate to be fastened 4, even when the latch main body 18 is moved rightward or leftward as indicated by an arrow R or L in FIG. 13A or 13B, the holding plate 12 on the backside of the plate to be fastened 4 functions to prevent dislocation of the latch main body 18 and, therefore, the latch main body 18 is held by the plate to be fastened 4 and is not released.

As above, a function of holding the latch main body 18 onto the plate to be fastened 4 that includes the hole 8 formed to have the increased inner diameter $\phi_1$ is obtained due to the holding plate 12. Therefore, the risk of loss, etc., of the latch main body 18 due to falling off thereof can be eliminated, the fastening work can become easy, and the workability thereof can be improved.

Figure 1:
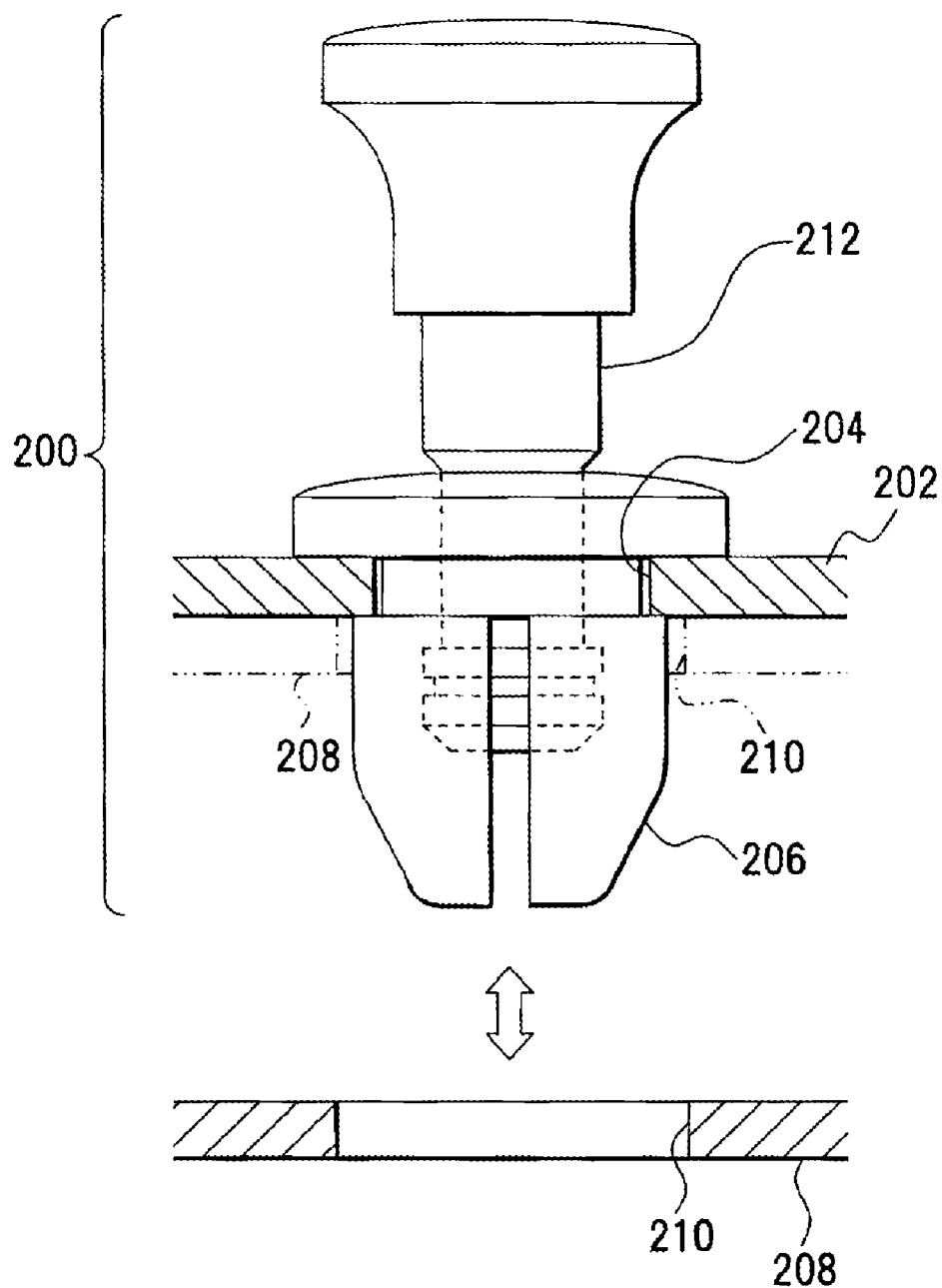
FIG. 1 is an explanatory diagram of a conventional fastening structure.
Figure 2:
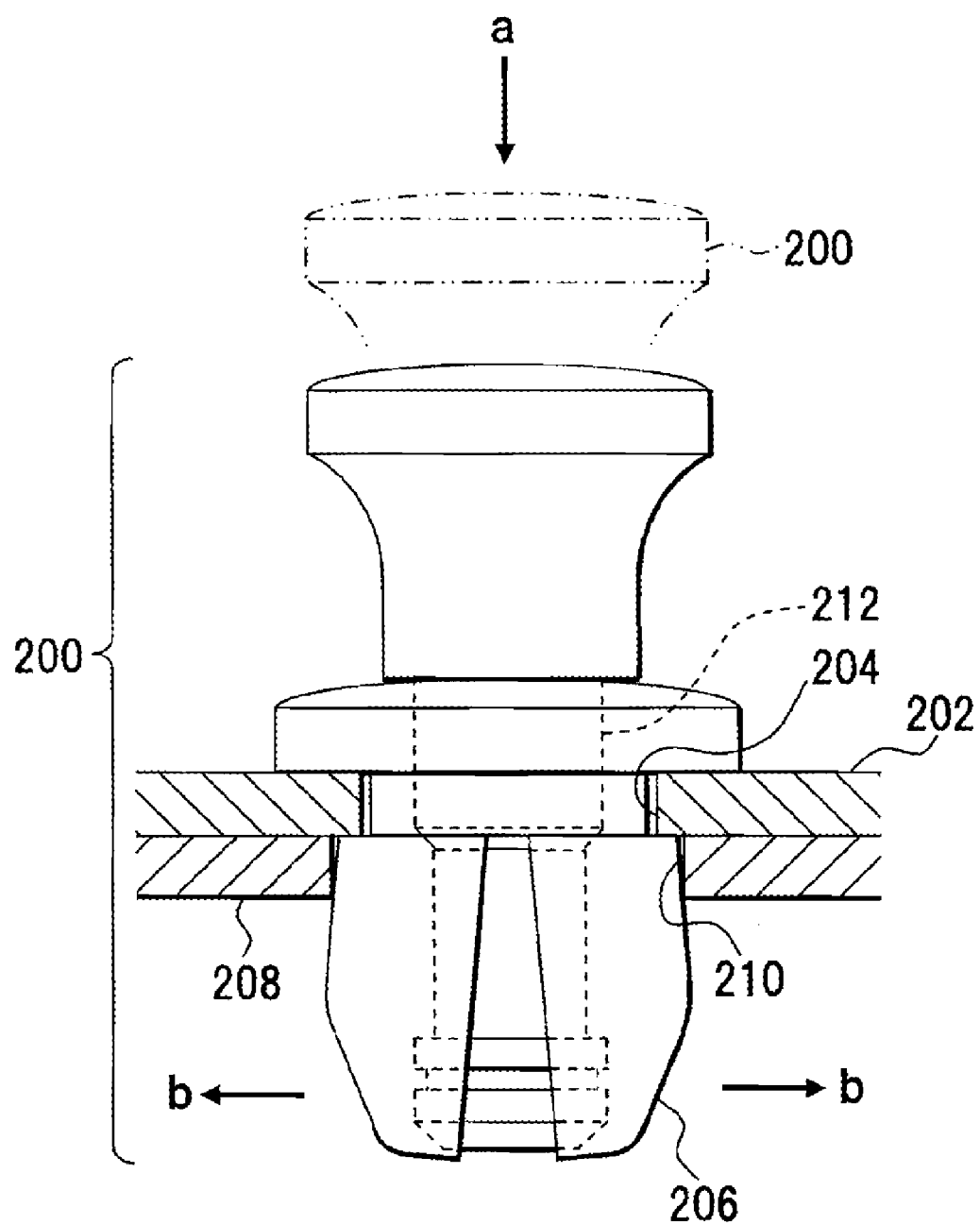
FIG. 2 is a diagram of the conventional fastening structure.
Figure 3:
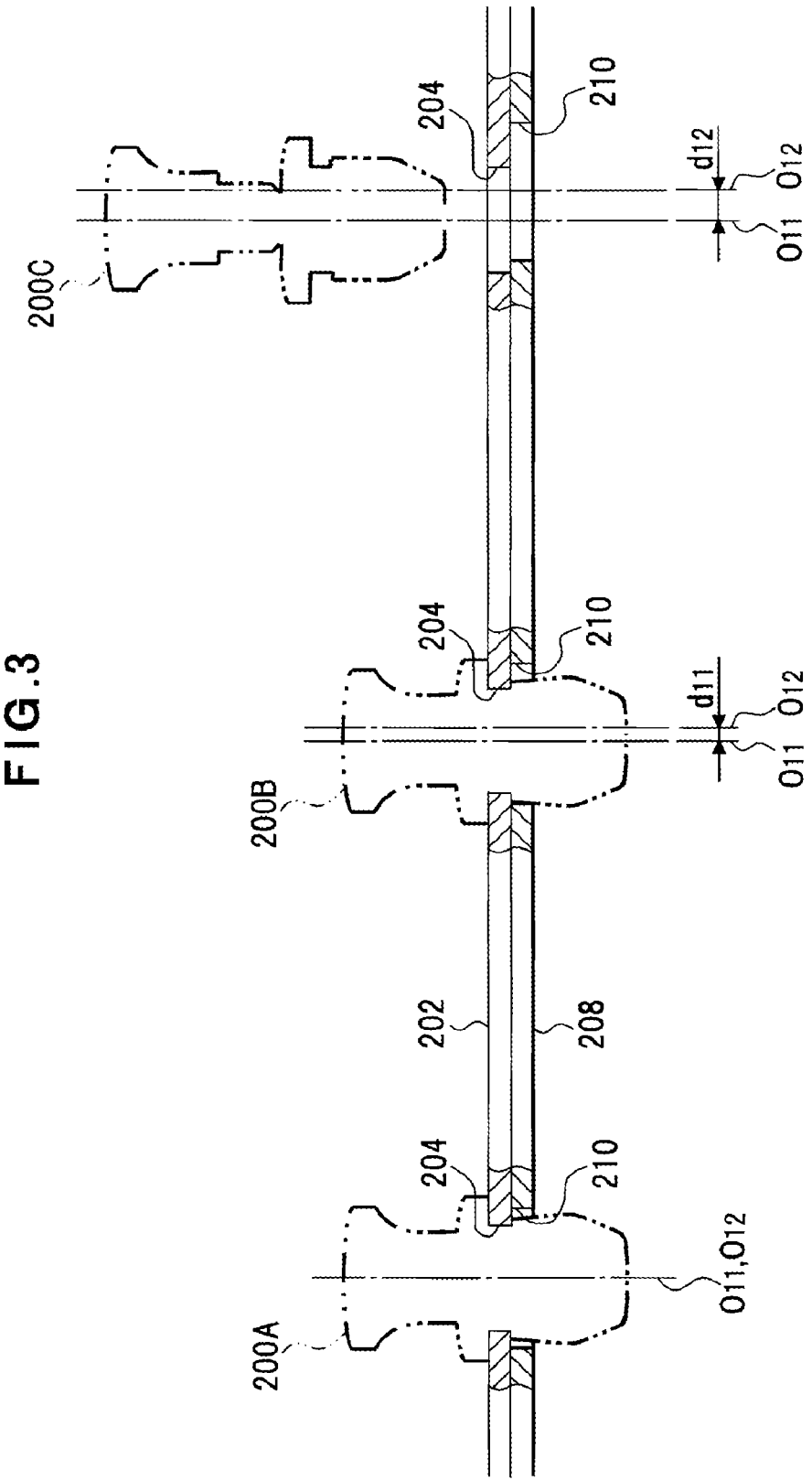
FIG. 3 is an explanatory diagram of an influence of manufacture tolerances of the fastening members.
Figure 4:
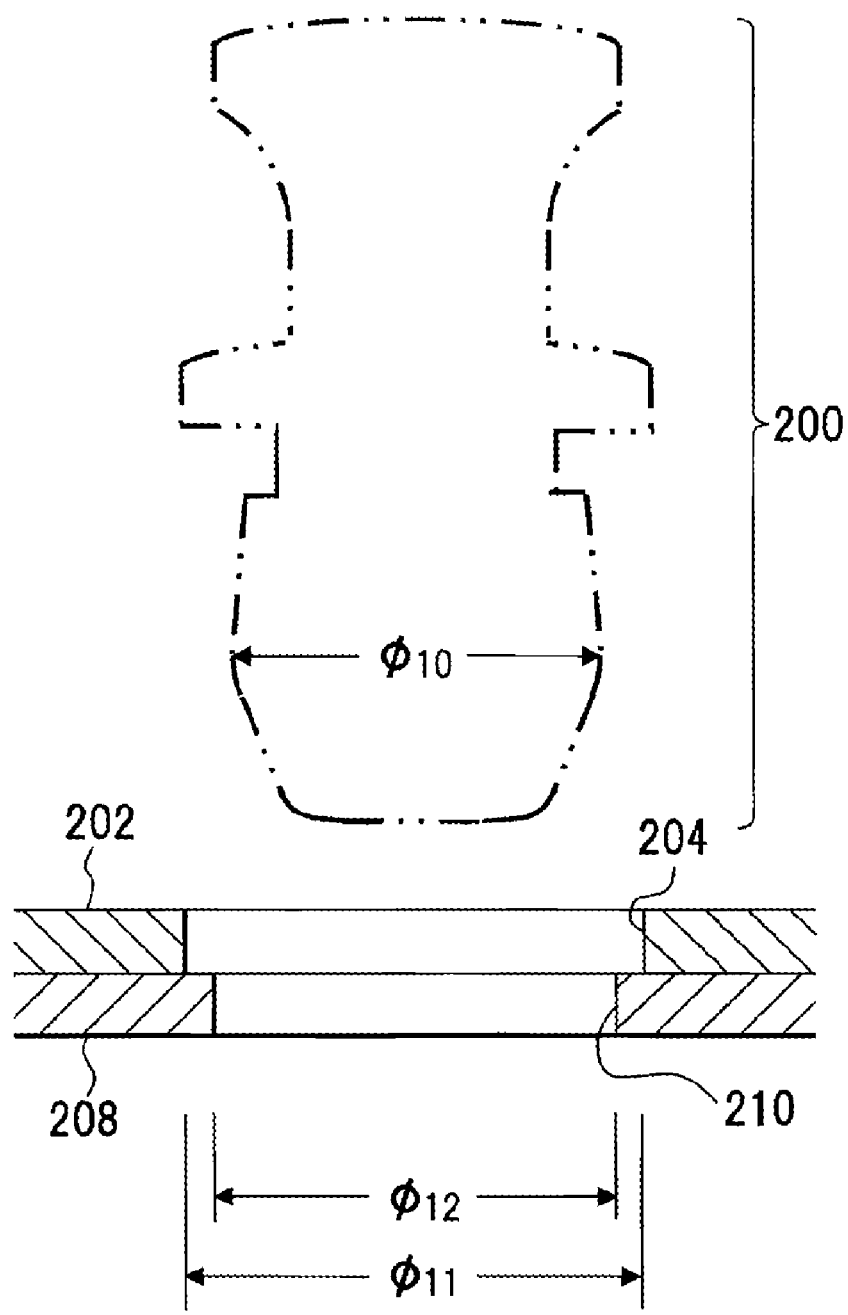
FIG. 4 is an explanatory diagram of an adjustment of hole diameters to absorb the manufacture tolerances of the fastening members.

As depicted in FIG. 14, assuming that a plurality of nylatches 14A, 14B and 14C fasten together the plates to be fastened 4 and 6, a difference is generated between the position of each hole 8 and the position of each hole 10 due to accumulation of manufacture tolerances in the plates to be fastened 4 and 6. Therefore, when the central axis $O_1$ of the hole 8 and the central axis $O_2$ of the hole 10 are caused to coincide with each other to fix the nylatch 14A and the nylatch 14A is fixed, a position difference $d_1$ ($<d_2$) is generated between the central axis $O_1$ of the hole 8 and the central axis $O_2$ of the hole 10 for the nylatch 14B that is adjacent to the nylatch 14A, and the position difference $d_2$ ($>d_1$) that is generated between the central axis $O_1$ of the hole 8 and the central axis $O_2$ of the hole 10 for the nylatch 14C becomes larger. In this case, the manufacture tolerances can be absorbed when the inner diameters $\phi_1$ of the hole 8 and $\phi_2$ of the hole 10 are increased. The holding plate 12 is put between the plates to be fastened 4 and 6 and the latch main body 18 of each of the nylatches 14A, 14B and 14C is held by the plate to be fastened 4. Therefore, the manufacture tolerances can be absorbed by the increased inner diameter of each of the holes 8 and 10 and, even when a position difference is generated between the central axes $O_1$ and $O_2$ of the holes 8 and 10 due to the accumulation of the manufacture tolerances, the plates to be fastened 4 and 6 can be securely and easily fastened together at a plurality of positions by the nylatches 14A, 14B and 14C. As opposed to the plurality of nylatches 200A, 200B and 200C (FIG. 3) that may not be fixed due to the scatter caused by the manufacture tolerances, the nylatches 14A, 14B and 14C can be fitted as above.

Second Embodiment

Figure 15:
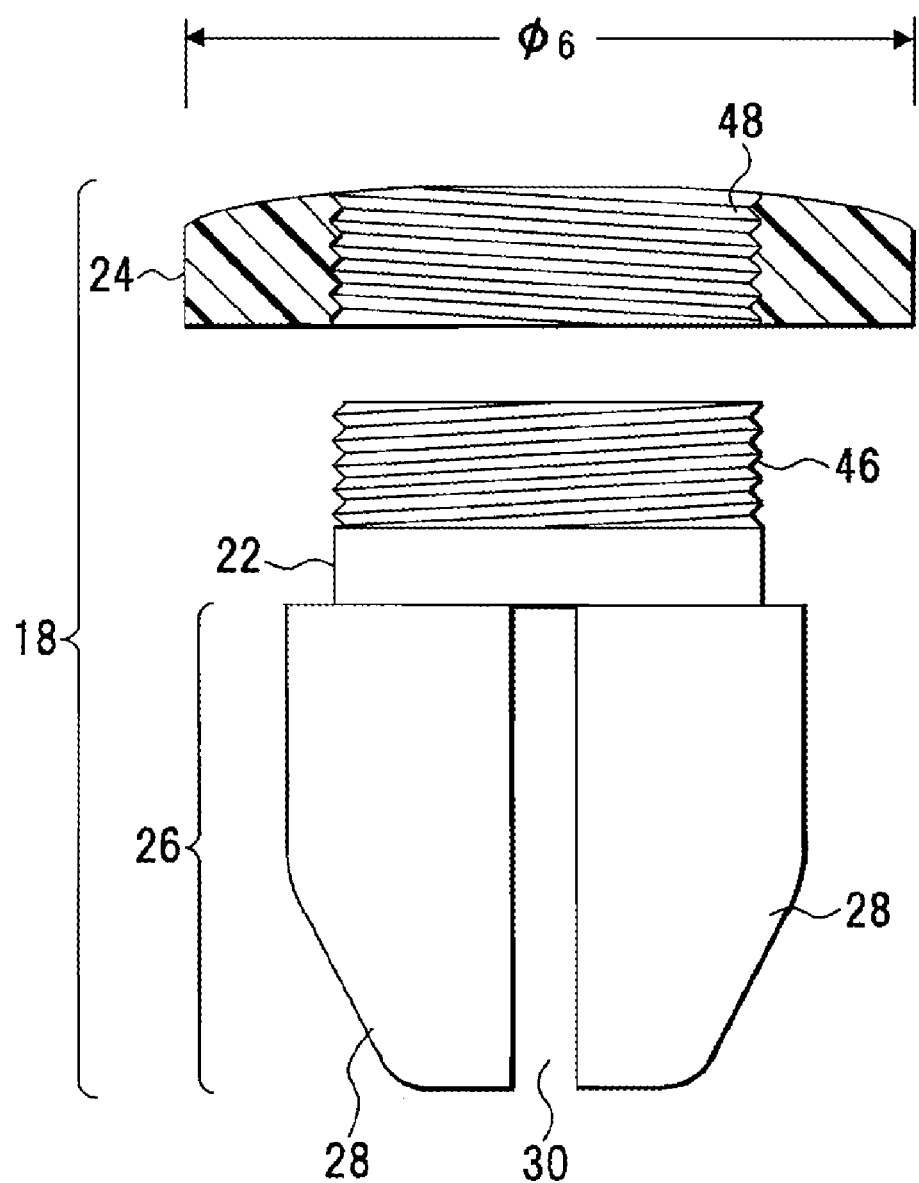
FIG. 15 is a diagram of a latch main body according to a second embodiment.

A second embodiment of the present invention will be described with reference to FIG. 15. FIG. 15 depicts a latch main body according to the second embodiment.

In the first embodiment, the stopping portion 24 is formed integrated into the latch main body 18. In this case, when the inner diameter $\phi_3$ of the hole 16 of the holding plate 12 is formed being smaller than the outer diameter $\phi_7$ of the anchoring unit 26, the stretchability, etc., that the material has may be used to attach the holding plate 12 to the cylinder portion 22. For example, when the nylatch 14 is made of a synthetic resin material and the holding plate 12 is made of a metal material, the stretchability that the nylatch 14 has may be used and, when the holding plate 12 and the nylatch 14 are both made of a synthetic resin material, their stretchability also may be used.

To further facilitate the attachment of the holding plate 12 to the latch main body 18, for example, as depicted in FIG. 15: the cylinder portion 22 and the stopping portion 24 of the latch main body 18 may separately be formed; the cylinder portion 22 may be extended; a thread portion 46 may be formed on the extended portion; and a thread portion 48 that corresponds to the thread portion 46 may be formed in the stopping portion 24. With such a configuration, the cylinder portion 22 and the stopping portion 24 can be attached and detached to/from each other using the thread portions 46 and 48 and, therefore, the holding plate 12 including the hole 16 that has the inner diameter $\phi_3$ that is approximate to the outer diameter $\phi_5$ of the cylinder portion 22 can easily be attached and detached. Therefore, the workability can be improved. In the case where the stopping portion 24 having a different outer diameter $\phi_6$ is prepared, even when the inner diameter $\phi_1$ of the hole 8 is set to be larger in the plate to be fastened 4 to absorb the manufacture tolerances, the stopping portion 24 whose outer diameter $\phi_6$ is set to be larger corresponding to the enlarged inner diameter $\phi_1$ can be used as necessary and, therefore, the convenience can be enhanced.

Third Embodiment

Figure 16:
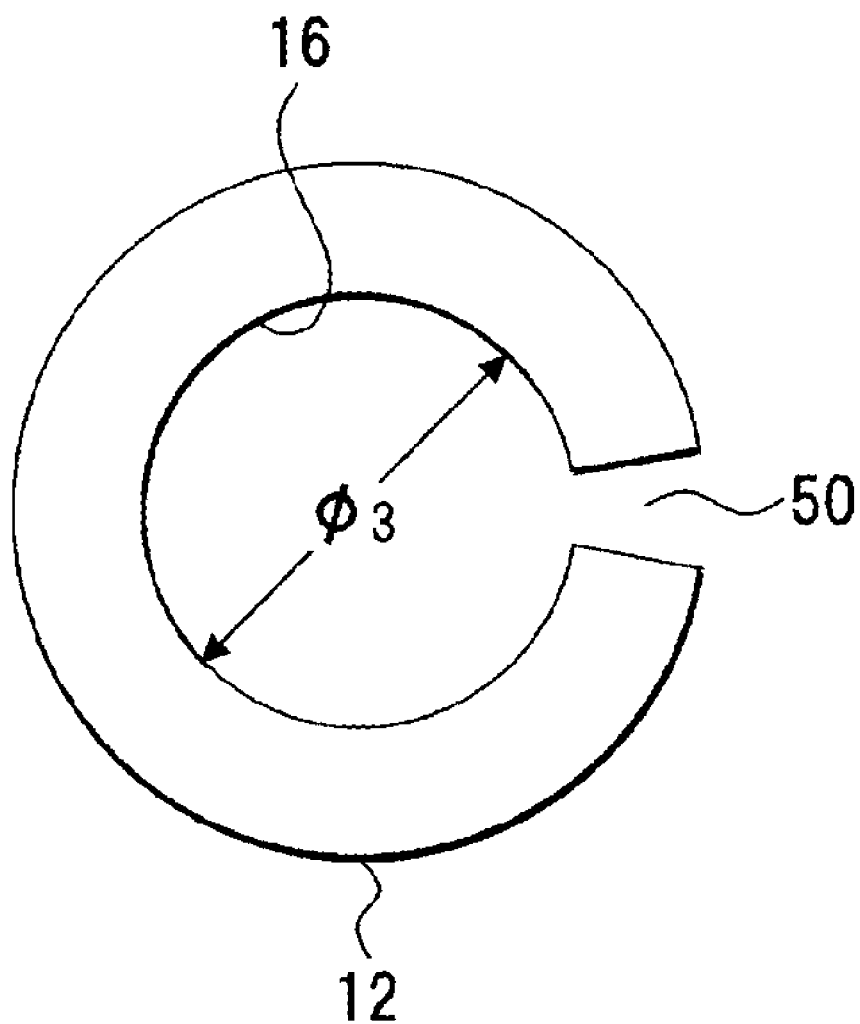
FIG. 16 is a diagram of a holding plate according to a third embodiment.

A third embodiment of the present invention will be described with reference to FIG. 16. FIG. 16 depicts a holding plate according to the third embodiment.

The holding plate 12 is formed to have no end and to be annular in the first and second embodiments. However, in the third embodiment, a cut-out portion 50 is provided for a portion of the holding plate 12 as depicted in FIG. 16 and, thereby, the holding plate 12 is formed with the inner diameter $\phi_3$ of the hole 16 thereof being capable of being increased or decreased as necessary. When the holding plate 12 is formed by a plastic material, the inner diameter $\phi_3$ can be increased by deforming the holding plate 12 using its plasticity when the holding plate 12 is attached, and the inner diameter $\phi_3$ can return to its original size. Using the holding plate 12 having such a configuration, the workability of its attachment to the latch main body 18 is improved.

Other Embodiments (1) In the above embodiments, the plates to be fastened 4 and 6 are exemplified as the two board-like members to be fastened that are fastened by the nylatch 14. However, the plates to be fastened 4 and 6 do not need to be made of a metal material and may be board-like members to be fastened that are formed by a non-metal material such as synthetic-resin boards.

(2) In the above embodiments, the nylatch 14 that is formed by a synthetic resin material is exemplified. However, the nylatch 14 may be formed by a metal material.

EXAMPLE

Figure 17:
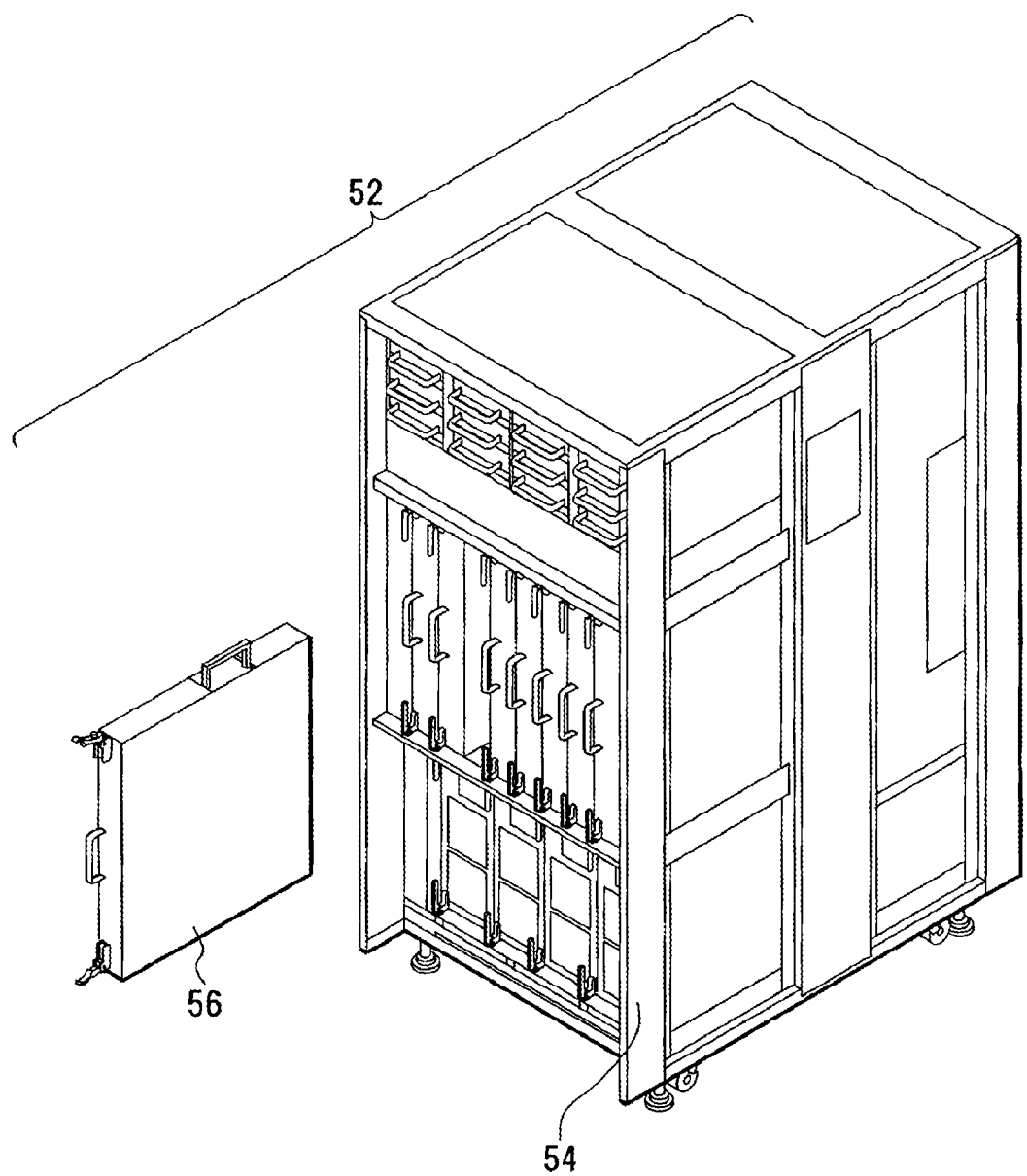
FIG. 17 is a perspective view of a server apparatus that is an example.
Figure 18:
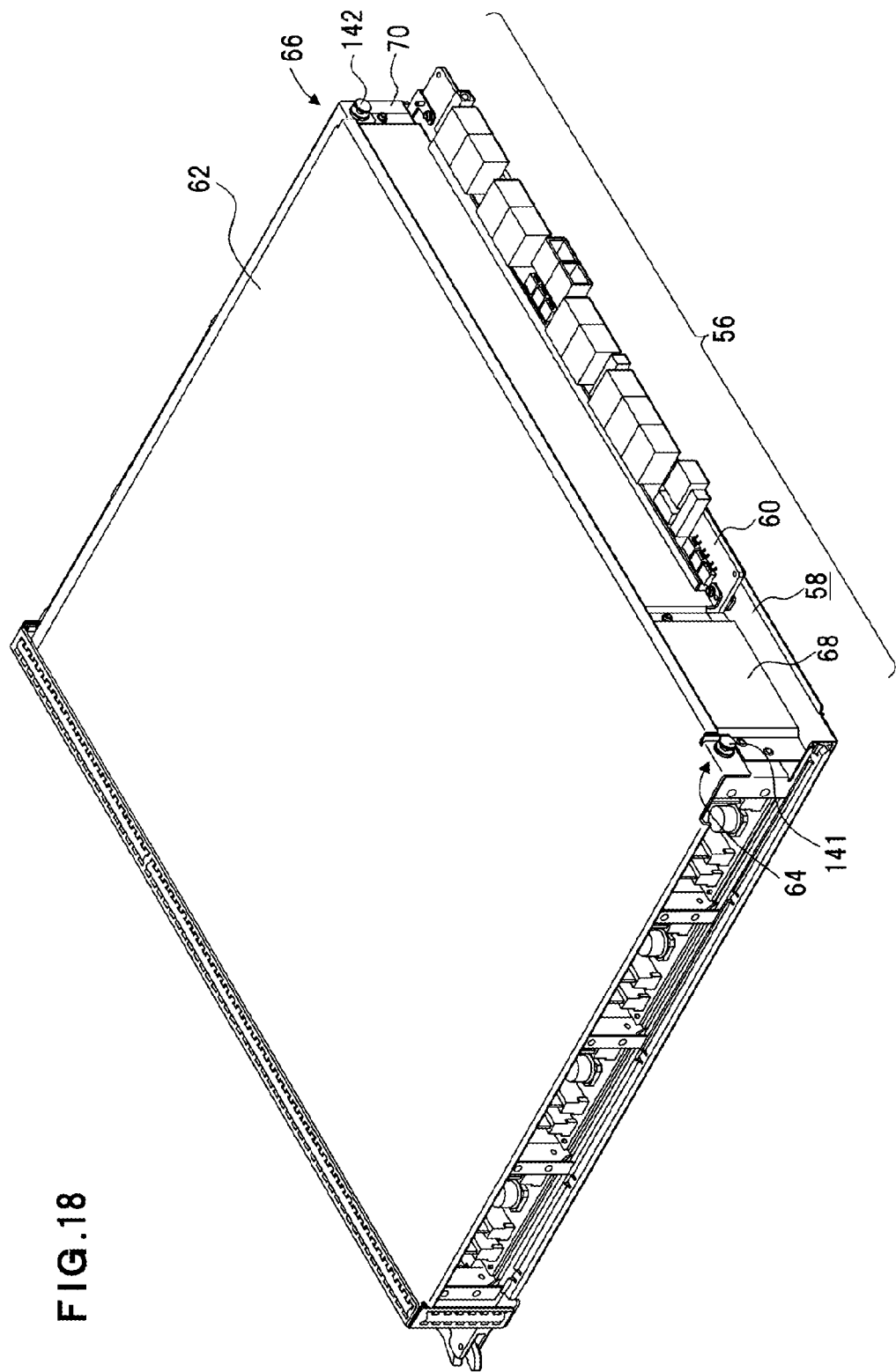
FIG. 18 is a perspective view of a system board unit.
Figure 19:
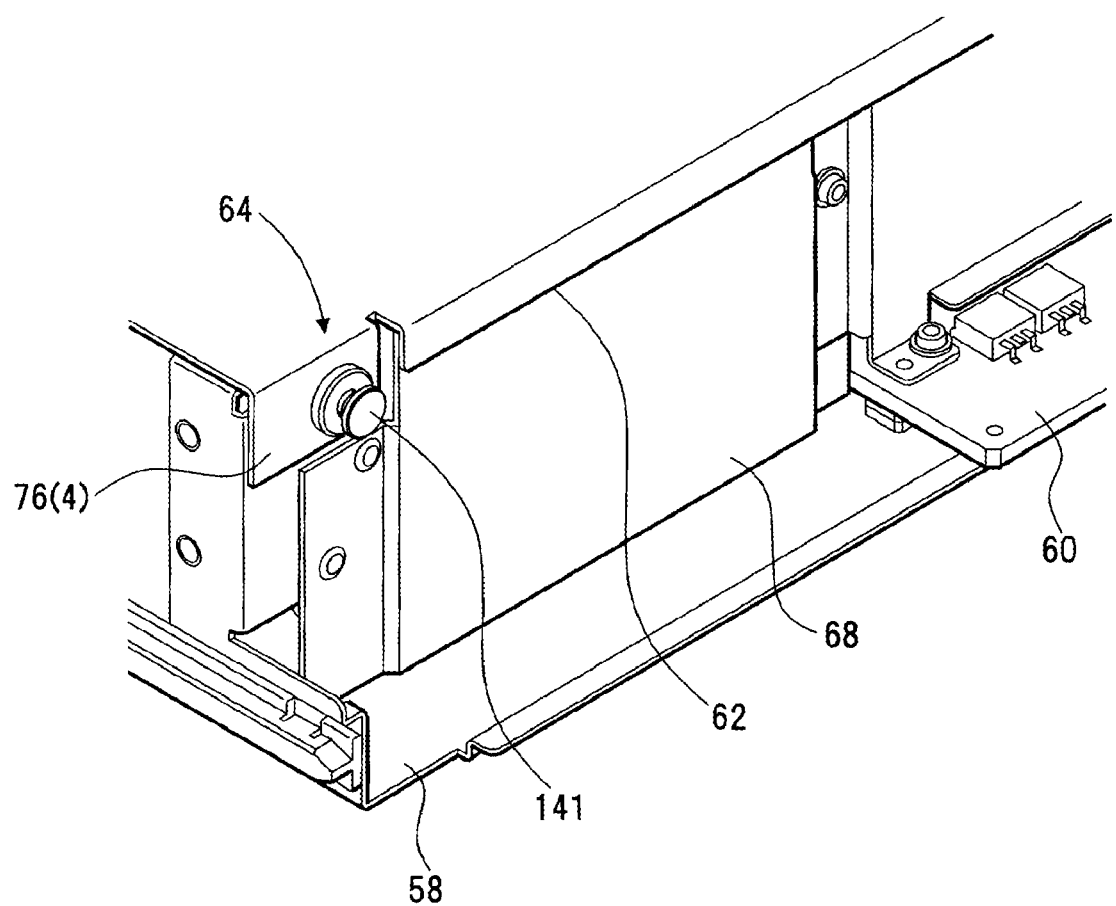
FIG. 19 is a partial perspective view of a first fastening unit.
Figure 20:
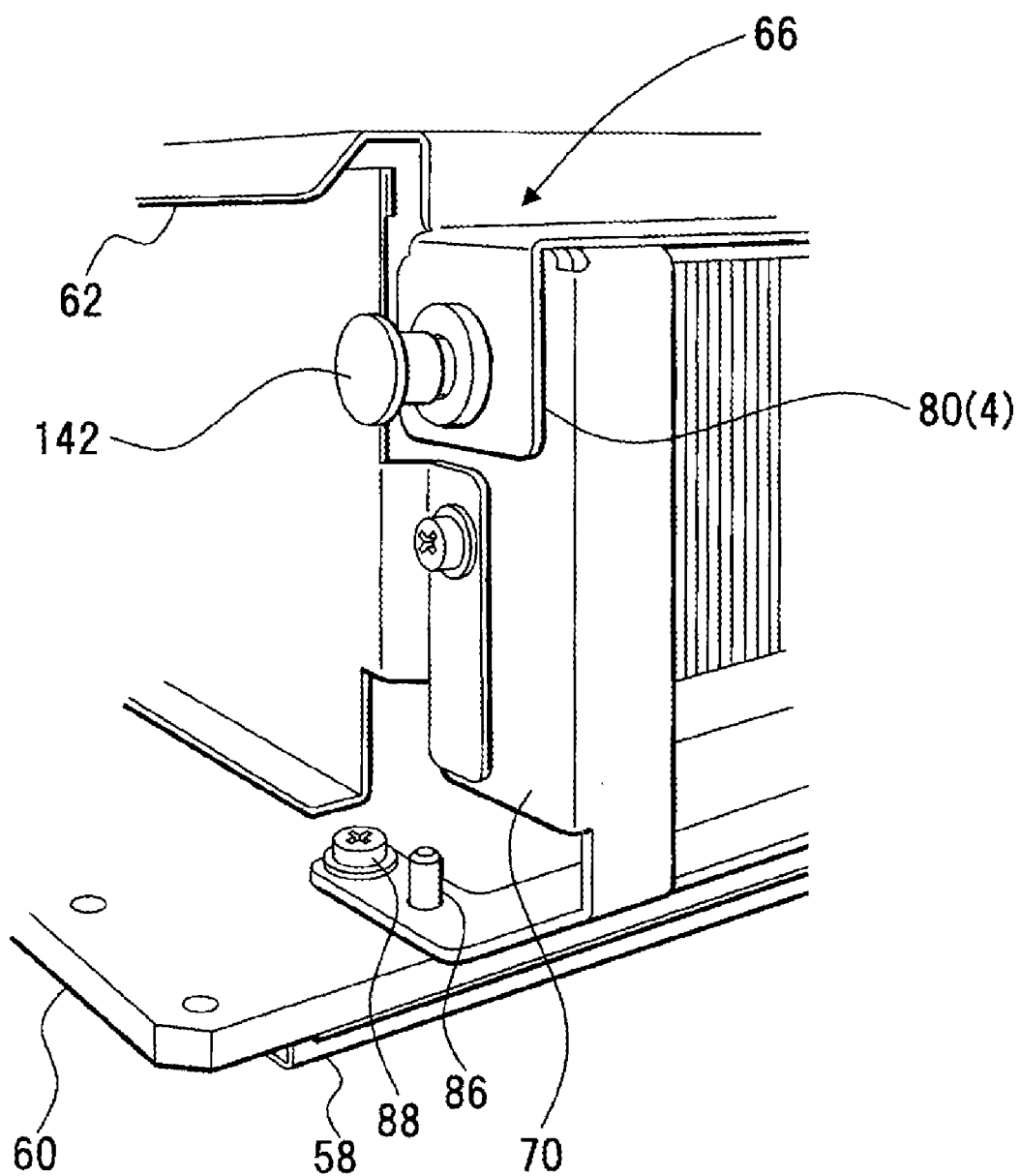
FIG. 20 is a partial perspective view of a second fastening unit.
Figure 21:
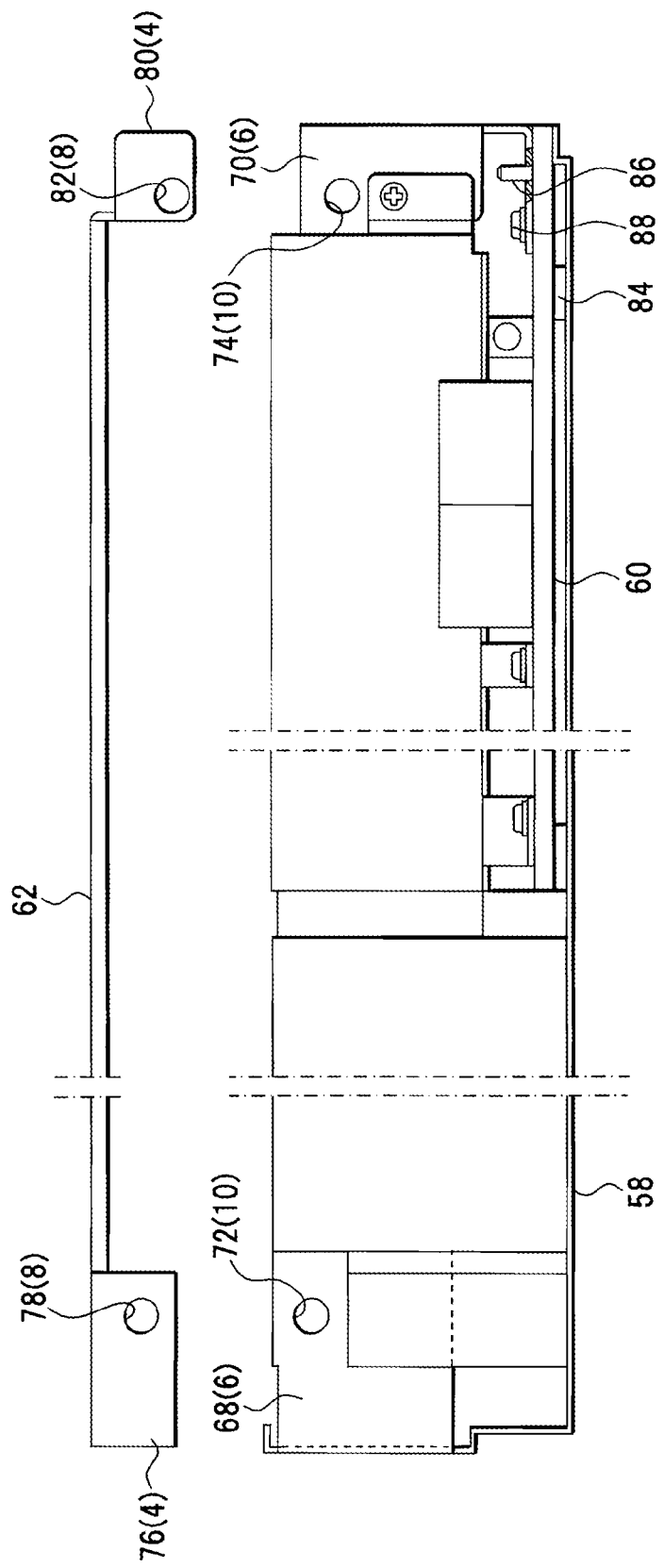
FIG. 21 is a diagram of the system board unit that is disassembled.
Figure 22:
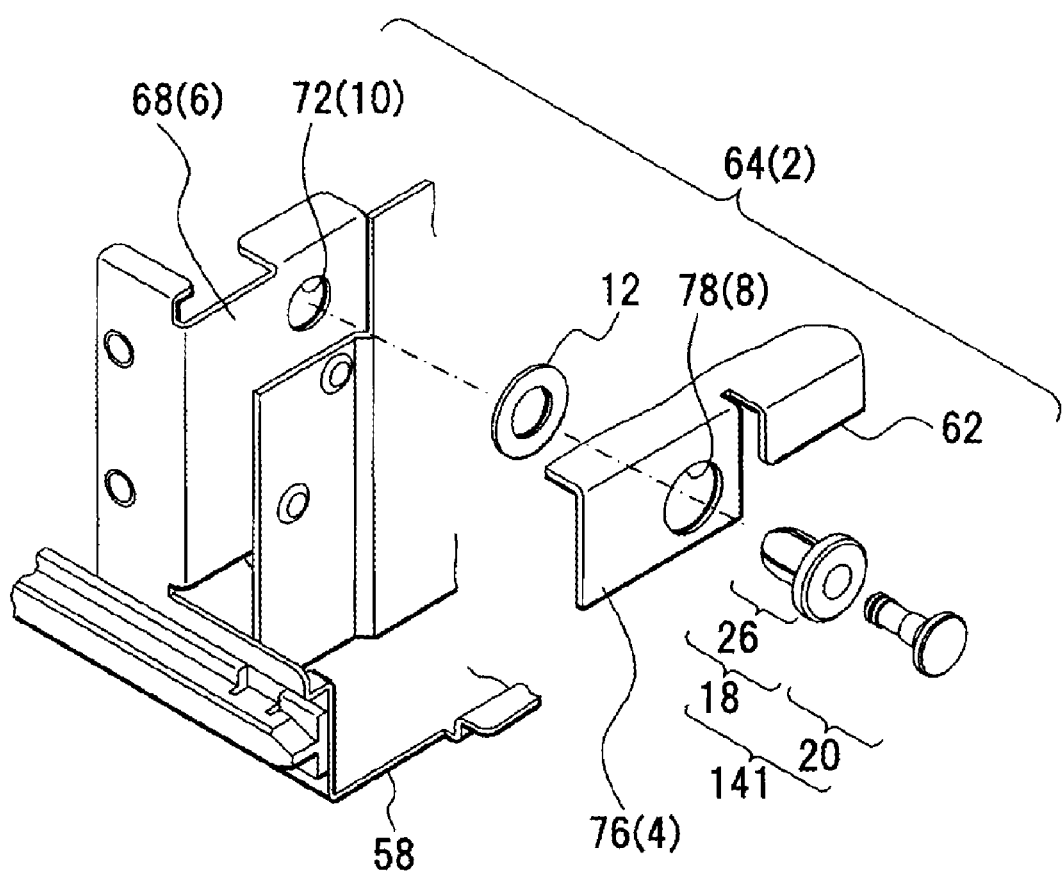
FIG. 22 is an exploded perspective view of the first fastening unit.
Figure 23:
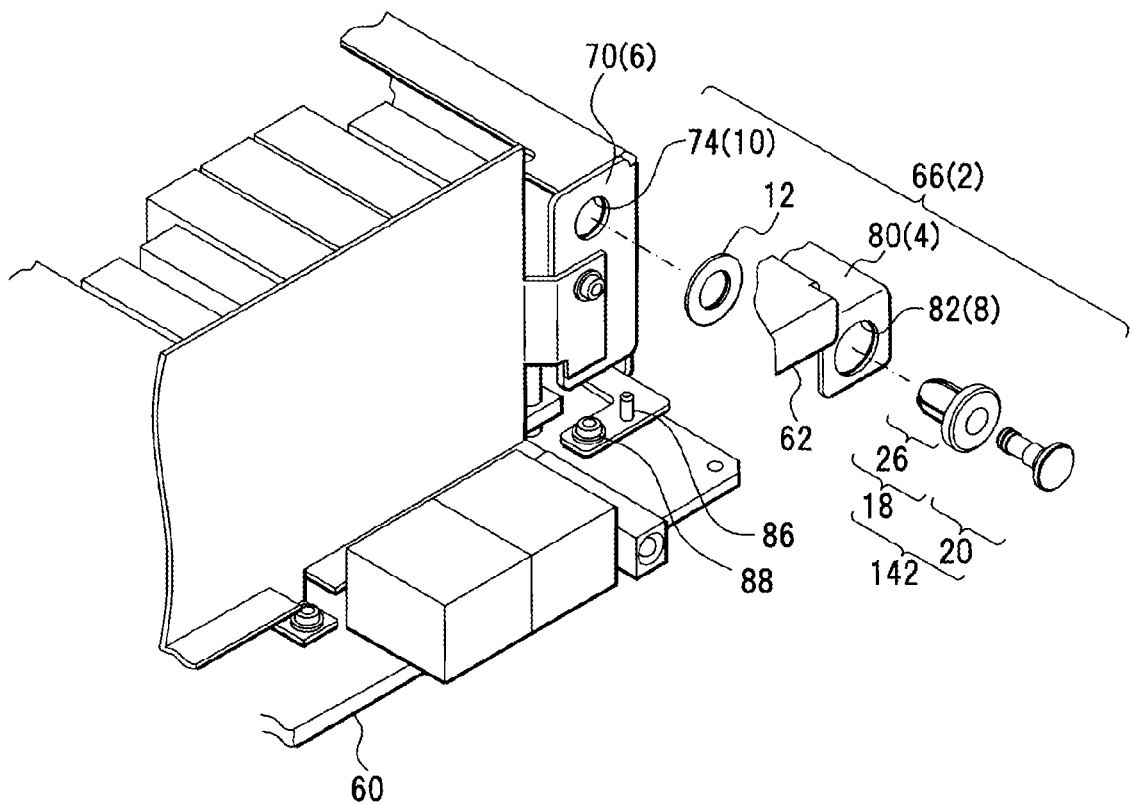
FIG. 23 is an exploded perspective view of the second fastening unit.

An example of the fastening structure or the fastening method of the present invention will be described with reference to FIGS. 17 to 23. FIG. 17 is a perspective view of a server apparatus. FIG. 18 is a perspective view of a system board unit. FIG. 19 is a partial perspective view of a first fastening unit. FIG. 20 is a partial perspective view of a second fastening unit. FIG. 21 depicts the system board unit that is disassembled. FIG. 22 is an exploded perspective view of the first fastening unit. FIG. 23 is an exploded perspective view of the second fastening unit. In FIGS. 17 to 23, the same parts as those in FIGS. 5 to 9 are given the same reference numerals.

A server apparatus 52 is an example of an electronic apparatus for which a fastening structure using the nylatch 14 (FIG. 5) is implemented and, as depicted in FIG. 17, the server apparatus 52 includes a housing unit 54. A plurality of system board units 56 are detachably installed in the housing unit 54.

As depicted in FIG. 18, each of the system board units 56 has a circuit board 60 installed in a chassis 58 and a lid unit 62 is installed on the top of the chassis 58. A first fastening unit 64 and a second fastening unit 66 are used to fasten together the chassis 58 or the circuit board 60 and the lid unit 62.

As depicted in FIG. 19, in the fastening unit 64, a nylatch 141 fastens together a standing wall portion 68 formed standing on the chassis 58 and the lid unit 62. As depicted in FIG. 20, in the fastening unit 66, a nylatch 142 fastens together a fixing plate 70 formed standing on the upside of the circuit board 60 and the lid unit 62. The circuit board 60 is formed by, for example, an insulating resin and is mounted with electronic devices such as memories.

As depicted in FIG. 21, in the system board unit 56, a fastening hole 72 is formed in the standing wall portion 68 formed standing on the chassis 58 and a fastening hole 74 is also formed in the fixing plate 70. In the lid unit 62, a fastening hole 78 is formed in a fixing portion 76 that covers the fastening hole 72 and a fastening hole 82 is also formed in a fixing portion 80 that covers the fastening hole 74. The fixing portions 76 and 80 each in this example are the first board-like member to be fastened and each correspond to the plate to be fastened 4 of the first embodiment. The fastening holes 78 and 82 each correspond to the hole 8. The standing wall portion 68 and the fixing plate 70 each are the second board-like member to be fastened and each correspond to the plate to be fastened 6 of the first embodiment. The fastening holes 72 and 74 each correspond to the hole 10.

As depicted in FIG. 22, the above fastening structure 2 and the above fastening method are used for the fastening unit 64, and the details thereof are as above and will not again be described. That is, the holding plate 12 is set inside the fixing portion 76 of the lid unit 62 and the latch main body 18 of the nylatch 141 is attached. Thereafter, the anchoring unit 26 of the latch main body 18 is inserted into the fastening hole 72 of the standing wall portion 68 and the latch operating unit 20 is forcibly inserted into the latch main body 18. Thereby, the lid unit 62 is fastened to the standing wall portion 68.

As depicted in FIG. 23, the above fastening structure 2 and the above fastening method are also used for the fastening unit 66, and the details thereof are as above and will not again be described. That is, the holding plate 12 is set inside the fixing portion 80 of the lid unit 62 and the latch main body 18 of the nylatch 142 is attached. Thereafter, the anchoring unit 26 of the latch main body 18 is inserted into the fastening hole 74 of the fixing plate 70 and the latch operating unit 20 is forcibly inserted into the latch main body 18. Thereby, the lid unit 62 is fastened to the fixing plate 70.

Figure 24:
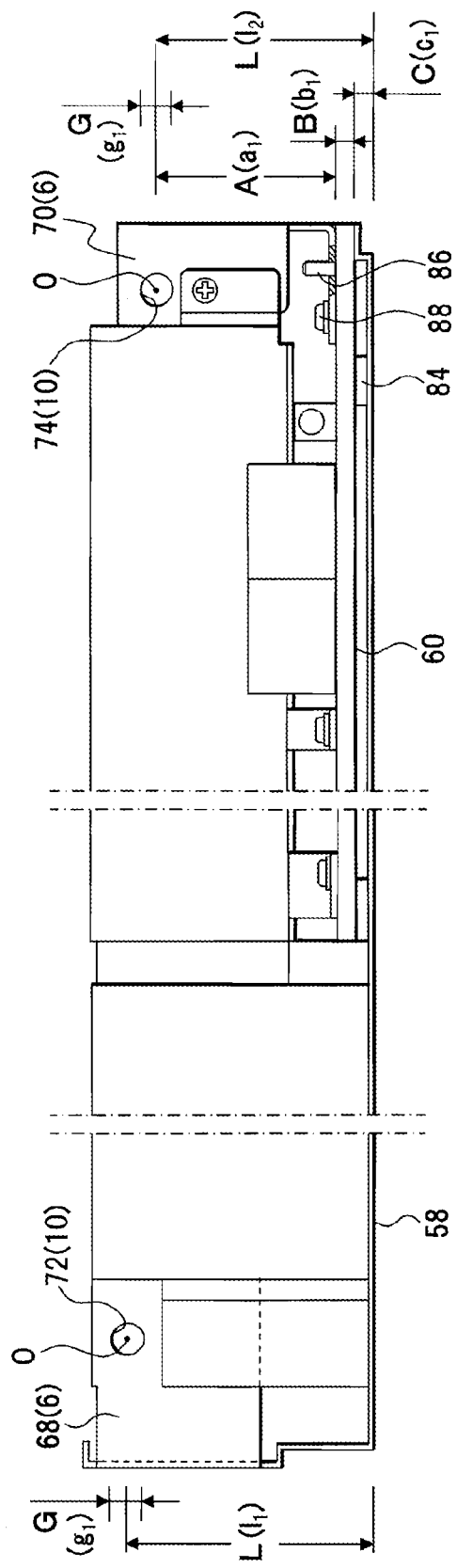
FIG. 24 is an explanatory diagram of manufacture tolerances in the server apparatus.
Figure 25:
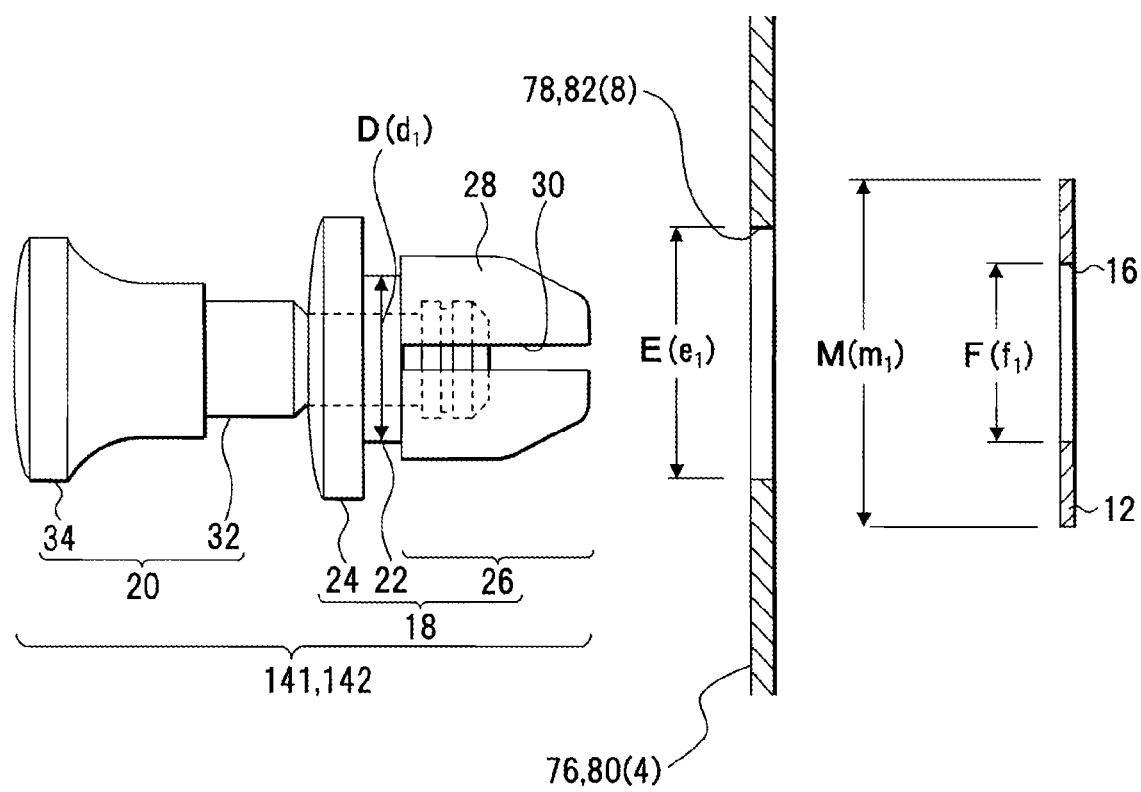
FIG. 25 is a diagram of the relation among members to be fastened, a holding plate and the nylatch.

The influence and the absorption of the manufacture tolerances in the fastening structure will be described with reference to FIGS. 24 and 25. FIG. 24 is an explanatory diagram of the manufacture tolerances in the server apparatus. FIG. 25 depicts the relation among the members to be fastened, the holding plate and the nylatch. In FIGS. 24 and 25, the same parts as those in FIGS. 5 to 8 and 17 to 23 are given the same reference numerals.

In the server apparatus 52: the dimension of the height from the bottom face of the chassis 58 to the center O of the fastening hole 72 of the standing wall portion 68 is denoted by "L"; the tolerance thereof is denoted by "$I_1$"; the dimension of the height from the bottom face of the chassis 58 to the center O of the fastening hole 74 of the fixing plate 70 is denoted by "L" ; and the tolerance thereof is denoted by "$I_2$". The standing wall portion 68 having the fastening hole 72 formed therein is formed being integrated into the chassis 58 whereas the fixing plate 70 having the fastening hole 74 formed therein is set on the circuit board 60 fixed to the chassis 58. That is, the circuit board 60 is set on the chassis 58 through a spacer 84 and the fixing plate 70 positioned by a fixing pin 86 provided stand on the circuit board 60 is fixed to the circuit board 60 by a fixing screw 88. Therefore, manufacturing tolerances such as that of the circuit board 60 is added to the dimension of the height L on the fastening hole 74 side.

Denoting the inner diameter of each of the fastening holes 72 and 74 as "G", the tolerance thereof as "$g_1$", the dimension of the height from the board surface of the circuit board 60 to the center "O" of the fastening hole 74 as "A", the tolerance thereof as "$a_1$", the thickness of the circuit board 60 as "B", the tolerance thereof as "$b_1$", the height of the chassis 58 that supports the circuit board 60 as "C", and the tolerance thereof as "$c_1$", the dimension of the height L on the fastening hole 74 side is obtained as follows.

$$L = A + B + C \quad (3)$$

The tolerance $I_2$ thereof is obtained as follows.

$$I_2 = a_1 + b_1 + c_1 \quad (4)$$

Therefore, the relation between the tolerances $I_1$ and $I_2$ is as follows.

$$I_1 < I_2 \quad (5)$$

As depicted in FIG. 25, for each of the nylatches 141 and 142, denoting the outer diameter of the cylinder portion 22 as "D", the tolerance thereof as "$d_1$", the dimension of the inner diameter of each of the fastening holes 78 and 82 on the lid unit 62 side as "E", the tolerance thereof as "$e_1$", the dimension of the outer diameter of the holding plate 12 as "M", the tolerance thereof as "$m_1$", the dimension of the inner diameter of the hole 16 as "F", and the tolerance thereof as "$f_1$", the relation between a difference between the dimension of the inner diameter F of the holding plate 12 and the dimension of the outer diameter D of the cylinder portion 22, and the tolerance $I_2$ is as follows.

$$(F - D)/2 < I_2 \quad (6)$$

The relation between a difference between the dimension of the inner diameter E of each of the fastening holes 78 and 82 and the dimension of the outer diameter D of the cylinder portion 22, and the tolerance $I_2$ is as follows.

$$(E-D)/2 > I_2 \quad (7)$$

Therefore, the holding plate 12 complements and absorbs the difference in the tolerances and the above fastening structure 2 can be obtained when the relation among a difference among the tolerances of the fastening holes 78 and 82, the dimension of the outer diameter M of the holding plate 12, and the tolerance thereof $m_1$ is as follows.

$$E+e_1 < M-m_1 \quad (8)$$

As above, the nylatches 141 and 142 are movable freely over the length of an interstice of each of the fastening holes 78 and 82 for floating and, even when a difference is generated due to the scatter of the manufacture of the fastening holes 72 and 74, etc., the nylatches 141 and 142 can be moved and fixed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

The embodiments of the present invention have been described as above. However, the present invention is not limited to the above description and those skilled in the art can naturally make various modifications and changes thereto based on the gist of the present invention that is described in claims or disclosed herein. It is needless to say that such modifications and changes are included in the scope of the present invention.

Technical ideas extracted from the above embodiments of the present invention will be listed. The technical ideas according to the present invention can be grasped at various levels and in various variations from generic concepts to limitative concepts and the present invention is not limited to the following description.

A fastening structure to fasten together a first board-like member to be fastened having a hole of a first inner diameter and a second board-like member to be fastened having a hole of a second inner diameter includes a stopping and anchoring part holding board-like member to be disposed between the first and the second board-like members to be fastened, the stopping and anchoring part holding board-like member having a hole of a third inner diameter, the third inner diameter being smaller than the first inner diameter; and a stopping and anchoring part to include a cylinder portion to have an outer diameter, the outer diameter being equal or approximate to the third inner diameter; a stopping portion to be formed on an upper portion of the cylinder portion, the stopping portion having an outer diameter, the outer diameter being larger than the first inner diameter; and an anchoring unit to be formed in a lower portion of the cylinder portion, the anchoring unit having an outer diameter, the outer diameter being equal or approximate to the second inner diameter, wherein the stopping and anchoring part fastens together the first and the second board-like members to be fastened due to the cylinder portion being held by the holding board-like member by being fitted into the holes of the first and the third inner diameters, and the anchoring unit fixing itself to the second board-like member to be fastened.

In the above fastening structure, preferably, a height of the cylinder portion may be equal or approximate to a value obtained by totaling a thickness of the first board-like member to be fastened and a thickness of the stopping and anchoring part holding board-like member. The anchoring unit may have a plurality of boards disposed on a same circumference with spacing between each other, and anchor itself to the second board-like member to be fastened using the plurality of boards being curved to extend a substantially-cylinder-like-shaped outer circumference thereof. The cylinder-like-shaped outer circumference of the anchoring unit may become smaller toward a tip thereof. The stopping and anchoring part further may have a bar-like member held inside the cylinder portion, and wherein the bar-like portion being forcibly inserted into the anchoring unit causes the plurality of boards that the anchoring unit has to be curved. The first board-like member to be fastened that has the hole of the first inner diameter may be provided standing on a circuit board incorporated in an electronic apparatus, and be fastened to the second board-like member to be fastened by the stopping and anchoring part.

A fastening method of fastening together a first board-like member to be fastened having a hole of a first inner diameter and a second board-like member to be fastened having a hole of a second inner diameter includes disposing a stopping and anchoring part holding board-like member having a hole of a third inner diameter that is smaller than the first inner diameter, between the first and the second board-like members to be fastened; causing the holding board-like member to hold a cylinder portion of a stopping and anchoring part that has the cylinder portion having an outer diameter equal or approximate to the third inner diameter, a stopping portion that is formed on an upper portion of the cylinder portion and that has an outer diameter larger than the first inner diameter, and an anchoring unit that is formed in a lower portion of the cylinder portion and that has an outer diameter equal or approximate to the second inner diameter, by fitting the cylinder portion into the holes of the first inner diameter and the third inner diameter, and anchoring the anchoring unit to the second board-like member to be fastened; and fastening together the first and the second board-like members to be fastened using the stopping and anchoring part.

In the above fastening method, preferably, a height of the cylinder portion may be equal or approximate to a value obtained by totaling a thickness of the first board-like member to be fastened and a thickness of the stopping and anchoring part holding board-like member. The anchoring unit may have a plurality of boards disposed on a same circumference with spacing between each other, and anchor itself to the second board-like member to be fastened using the plurality of plates being curved to extend an outer circumference of the cylinder portion. A shape of the outer circumference of the cylinder portion that the anchoring portion has may become smaller toward a tip thereof. The stopping and anchoring part may further have a bar-like member held inside the cylinder portion, and wherein the bar-like member being forcibly inserted into the anchoring portion causes the plurality of plates that the anchoring unit has to be curved.

According to the embodiments of the present invention, the following effects can be achieved.

(1) The stopping and anchoring part inserted into each hole of the first and second board-like members to be fastened that are to be fastened together are freely movable. Therefore, even when a difference is present between the first inner diameter of the hole of the first board-like member to be fastened and the second inner diameter of the hole of the second board-like member to be fastened due to the manufacture tolerances of the board-like members to be fastened, the first and the second board-like members to be fastened can be fastened together by moving the stopping and anchoring part.

(2) When the fastening holes are formed at a plurality of positions of the first and the second board-like members to be fastened that are to be fastened together, the stopping and anchoring part inserted into each of the holes is also freely movable. Therefore, though the board-like members to be fastened conventionally may not be fastened when a difference is present between the first inner diameter of each of the holes of the first board-like member to be fastened and the second inner diameter of each of the holes of the second board-like member to be fastened due to the manufacture tolerances of the board-like members to be fastened, the first and the second board-like members to be fastened can be fastened together at the plurality of positions because the each of the stopping and anchoring part is movable in the present invention.

(3) Before fastening together the first and the second board-like members to be fastened, the stopping and anchoring part can be held using the stopping and anchoring part holding board-like member against the first and the second board-like members to be fastened. As a result, the stopping and anchoring part can be prevented from being released from the board-like members to be fastened before the fastening thereof and, therefore, the workability of the fastening can be improved.

The embodiments of the present invention can be used for fastening, and attachment and detachment of the members used for housing that is configured by fastening together a plurality of board-like members, of electronic apparatuses, etc., such as a server apparatus, and the stopping and anchoring part of the nylatch, etc., has the floating structure and is held by the board-like members. Therefore, errors caused by manufacture tolerances of the members to which the nylatches are fitted can be absorbed and, therefore, the members can be fastened together. Therefore, the embodiments are useful.

What is claimed is:

1. A fastening structure to fasten together a first board-shaped member to be fastened having a hole of a first inner diameter and a second board-shaped member to be fastened having a hole of a second inner diameter, comprising:
   a holding plate to hold a stopping and anchoring part and to be disposed between the first and the second board-shaped members to be fastened, the holding plate having a hole of a third inner diameter, the third inner diameter being smaller than the first inner diameter; and
   the stopping and anchoring part to include
      a cylinder portion to have an outer diameter, the outer diameter being equal or approximate to the third inner diameter;
      a stopping portion to be formed on an upper portion of the cylinder portion, the stopping portion having an outer diameter, the outer diameter being larger than the first inner diameter; and
      an anchoring unit to be formed in a lower portion of the cylinder portion, the anchoring unit having an outer diameter, the outer diameter being smaller than the first inner diameter, being equal or approximate to the second inner diameter and being larger than the third inner diameter,
   wherein the stopping and anchoring part fastens together the first and the second board-shaped members to be fastened due to the cylinder portion being held by the holding plate by being fitted into the holes of the first and the third inner diameters, and the anchoring unit fixing itself to the second board-shaped member to be fastened.

2. The fastening structure of claim 1, wherein
a height of the cylinder portion is equal or approximate to a value obtained by totaling a thickness of the first board-shaped member to be fastened and a thickness of the holding plate.

3. The fastening structure of claim 1, wherein
the anchoring unit has a plurality of boards disposed on a same circumference with spacing between each other, and anchors itself to the second board-shaped member to be fastened using the plurality of boards being curved to extend a substantially-cylinder-shaped outer circumference thereof.

4. The fastening structure of claim 2, wherein
the anchoring unit has a plurality of boards disposed on a same circumference with spacing between each other, and anchors itself to the second board-shaped member to be fastened using the plurality of boards being curved to extend a substantially-cylinder-shaped outer circumference thereof.

5. The fastening structure of claim 3, wherein
the substantially cylinder-shaped outer circumference of the anchoring unit becomes smaller toward a tip thereof.

6. The fastening structure of claim 4, wherein
the substantially cylinder-shaped outer circumference of the anchoring unit becomes smaller toward a tip thereof.

7. The fastening structure of claim 5, wherein
the stopping and anchoring part further has a bar-shaped member held inside the cylinder portion, and wherein
the bar-shaped member being forcibly inserted into the anchoring unit causes the plurality of boards that the anchoring unit has to be curved.

8. The fastening structure of claim 6, wherein
the stopping and anchoring part further has a bar-shaped member held inside the cylinder portion, and wherein
the bar-shaped member being forcibly inserted into the anchoring unit causes the plurality of boards that the anchoring unit has to be curved.

9. The fastening structure of claim 1, wherein
the first board-shaped member to be fastened that has the hole of the first inner diameter is provided standing on a circuit board incorporated in an electronic apparatus, and is fastened to the second board-shaped member to be fastened by the stopping and anchoring part.

10. A fastening method of fastening together a first board-shaped member to be fastened having a hole of a first inner diameter and a second board-shaped member to be fastened having a hole of a second inner diameter, comprising:
   disposing a holding plate to hold a stopping and anchoring part, the holding plate having a hole of a third inner diameter that is smaller than the first inner diameter, between the first and the second board-shaped members to be fastened;
   causing the holding plate to hold a cylinder portion of the stopping and anchoring part that has the cylinder portion having an outer diameter equal or approximate to the third inner diameter, a stopping portion that is formed on an upper portion of the cylinder portion and that has an outer diameter larger than the first inner diameter, and an anchoring unit that is formed in a lower portion of the cylinder portion and that has an outer diameter, the outer diameter being smaller than the first inner diameter, being equal or approximate to the second inner diameter and being larger than the third inner diameter, by fitting the cylinder portion into the holes of the first inner diameter and the third inner diameter, and anchoring the anchoring unit to the second board-shaped member to be fastened; and fastening together the first and the second board-shaped members to be fastened using the stopping and anchoring part.

11. The fastening method of claim 10, wherein a height of the cylinder portion is equal or approximate to a value obtained by totaling a thickness of the first board-shaped member to be fastened and a thickness of the holding plate.

12. The fastening method of claim 10, wherein the anchoring unit has a plurality of boards disposed on a same circumference with spacing between each other, and anchors itself to the second board-shaped member to be fastened using the plurality of boards being curved to extend an outer circumference of the cylinder portion.

13. The fastening method of claim 12, wherein a shape of the outer circumference of the cylinder portion that the anchoring unit has becomes smaller toward a tip thereof.

14. The fastening method of claim 13, wherein the stopping and anchoring part further has a bar-shaped member held inside the cylinder portion, and wherein the bar-shaped member being forcibly inserted into the anchoring portion causes the plurality of boards that the anchoring unit has to be curved.

* * * * *